(12) United States Patent
Fukushima et al.

(10) Patent No.: US 9,634,339 B2
(45) Date of Patent: Apr. 25, 2017

(54) REDOX FLOW BATTERY AND METHOD OF OPERATING THE SAME

(71) Applicant: LE SYSTEM CO., LTD., Kurume-shi, Fukuoka (JP)

(72) Inventors: Junichi Fukushima, Kurume (JP); Kanji Sato, Kurume (JP); Keiji Hirano, Kurume (JP)

(73) Assignee: LE SYSTEM CO., LTD., Kurume-Shi, Fukuoka (JP)

( * ) Notice: Subject to any disclaimer, the term of this patent is extended or adjusted under 35 U.S.C. 154(b) by 0 days.

(21) Appl. No.: 14/781,552

(22) PCT Filed: Mar. 31, 2014

(86) PCT No.: PCT/JP2014/001903
§ 371 (c)(1),
(2) Date: Sep. 30, 2015

(87) PCT Pub. No.: WO2014/162729
PCT Pub. Date: Oct. 9, 2014

(65) Prior Publication Data
US 2016/0049673 A1    Feb. 18, 2016

(30) Foreign Application Priority Data

Mar. 30, 2013    (WO) .................. PCT/JP2013/002206

(51) Int. Cl.
*H01M 8/04*    (2016.01)
*H01M 8/04186*    (2016.01)
(Continued)

(52) U.S. Cl.
CPC .... *H01M 8/04186* (2013.01); *G01R 31/3606* (2013.01); *H01M 8/04223* (2013.01);
(Continued)

(58) Field of Classification Search
CPC ............. H01M 8/04186; H01M 8/188; H01M 8/04544; H01M 8/04223
See application file for complete search history.

(56) References Cited

U.S. PATENT DOCUMENTS

| 2005/0147871 A1 | 7/2005 | Shigematsu et al. |
| 2005/0158614 A1 | 7/2005 | Hennessy |
(Continued)

FOREIGN PATENT DOCUMENTS

| JP | H07-192747 A | 7/1995 |
| JP | H08-138718 A | 5/1996 |
(Continued)

OTHER PUBLICATIONS

International Search Report (PCT/ISA/210) mailed on Jun. 10, 2014, by the Japanese Patent Office as the International Searching Authority for International Application No. PCT/JP2014/001903.
(Continued)

*Primary Examiner* — Helen O Conley
(74) *Attorney, Agent, or Firm* — Buchanan Ingersoll & Rooney PC

(57) ABSTRACT

A redox flow battery includes: a positive electrolyte storage tank; a negative electrolyte storage tank; a cell stack; a positive electrolyte outward path that sends positive electrolyte to positive electrode chambers in the cell stack; a positive electrolyte return path that sends positive electrolyte to the positive electrolyte storage tank; a negative electrolyte outward path that sends negative electrolyte to negative electrode chambers of the cells; a negative electrolyte return path that sends negative electrolyte to the negative electrolyte storage tank; an entrance open circuit voltage measuring portion that measures an upstream open circuit voltage between the positive electrolyte inside the positive electrolyte outward path and the negative electrolyte inside the negative electrolyte outward path; and an exit open circuit voltage measuring portion that measures a downstream open circuit voltage between the positive electrolyte inside the
(Continued)

positive electrolyte return path and the negative electrolyte inside the negative electrolyte return path.

16 Claims, 15 Drawing Sheets

(51) Int. Cl.
    *H01M 8/18*     (2006.01)
    *H01M 8/04537*     (2016.01)
    *G01R 31/36*     (2006.01)
    *H01M 8/04223*     (2016.01)
    *H01M 8/20*     (2006.01)

(52) U.S. Cl.
    CPC ....... *H01M 8/04544* (2013.01); *H01M 8/188* (2013.01); *H01M 8/20* (2013.01); *Y02E 60/528* (2013.01)

(56) References Cited

U.S. PATENT DOCUMENTS

2005/0164075 A1     7/2005     Kumamoto et al.
2008/0081247 A1     4/2008     Nakaishi et al.

FOREIGN PATENT DOCUMENTS

| JP | H11-031522 A | 2/1999 |
| JP | H11-204124 A | 7/1999 |
| JP | 2000-030721 A | 1/2000 |
| JP | 2000-260460 A | 9/2000 |
| JP | 2001-167787 A | 6/2001 |
| JP | 2002-367659 A | 12/2002 |
| JP | 2003-317763 A | 11/2003 |
| JP | 2003-317788 A | 11/2003 |
| JP | 2007-087829 A | 4/2007 |
| JP | 2008-527647 A | 7/2008 |
| JP | 2011-119283 A | 6/2011 |
| WO | 90/03666 A1 | 4/1990 |
| WO | 2012/020277 A1 | 2/2012 |

OTHER PUBLICATIONS

Written Opinion (PCT/ISA/237) mailed on Jun. 10, 2014, by the Japanese Patent Office as the International Searching Authority for International Application No. PCT/JP2014/001903.

Extended European Search Report dated Sep. 15, 2016 issued in corresponding European Patent Appln. No. 14779360.8 (5 pages).

REDOX FLOW BATTERY AND METHOD OF OPERATING THE SAME

TECHNICAL FIELD

The present invention relates to a redox flow battery and a method of operating the same.

BACKGROUND ART

In one example of a redox flow battery, one out of a plurality of cells that construct a cell stack is an auxiliary cell that is not normally connected to a DC/AC converter, and charging/discharging control is carried out by understanding the charging/discharging state of electrolyte storage tanks based on the open circuit voltage (OCV) measured using the auxiliary cell (see Patent Document 1).

BACKGROUND ART DOCUMENTS

Patent Documents

Japanese Laid-Open Patent Publication No. 2003-317788

Problem to be Solved by the Invention

However, in the conventional redox flow battery described above, the charging/discharging state of the electrolyte storage tanks is known using the open circuit voltage measured at the auxiliary cell mentioned above, and although it may be possible to know the charging/discharging state of the electrolyte storage tanks to a certain extent, it is not possible to know the state inside the cell stack.

The present invention was conceived in view of the problem described above and has an object of providing a redox flow battery which makes it possible to know the charging/discharging state inside the cell stack, and a method of operating the same.

Means for Solving the Problem

An aspect of the present invention is a redox flow battery including: a positive electrolyte storage tank; a negative electrolyte storage tank; a cell stack; a positive electrolyte outward path that sends positive electrolyte, which has been sent out from the positive electrolyte storage tank, to positive electrode chambers of cells in the cell stack; a positive electrolyte return path that sends positive electrolyte, which has flowed out from the positive electrode chambers, to the positive electrolyte storage tank; a negative electrolyte outward path that sends negative electrolyte, which has been sent out from the negative electrolyte storage tank, to negative electrode chambers of the cells; and a negative electrolyte return path that sends negative electrolyte, which has flowed out from the negative electrode chambers, to the negative electrolyte storage tank, the redox flow battery including: an upstream open circuit voltage measuring portion that measures an upstream open circuit voltage between the positive electrolyte inside the positive electrolyte outward path and the negative electrolyte inside the negative electrolyte outward path; and a downstream open circuit voltage measuring portion that measures a downstream open circuit voltage between the positive electrolyte inside the positive electrolyte return path and the negative electrolyte inside the negative electrolyte return path. The cell stack includes a plurality of sub-stack cells composed of a plurality of unit cells, each sub-stack cell includes a pair of liquid separation plates composed of a first liquid separation plate that is one liquid separation plate and in which a negative electrolyte inflow path, which is a downstream portion of the negative electrolyte outward path, is formed and a second liquid separation plate that is another liquid separation plate and in which a positive electrolyte inflow path, which is a downstream portion of the positive electrolyte outward path, is formed, out of a positive electrolyte outflow path, which is an upstream portion of the positive electrolyte return path, and a negative electrolyte outflow path, which is an upstream portion of the negative electrolyte return path, one outflow path is formed in the first liquid separation plate and another outflow path is formed in the second liquid separation plate, the first liquid separation plate of a first sub-stack cell, which is one out of the plurality of sub-stack cells, is disposed adjacent to the second liquid separation plate of a second sub-stack cell with is disposed next to the first sub-stack cell, the upstream open circuit voltage measuring portion measures the upstream open circuit voltage between the positive electrolyte inside the positive electrolyte outward path which is connected to the second liquid separation plate of the second sub-stack cell and the negative electrolyte inside the negative electrolyte outward path which is connected to the first liquid separation plate of the first sub-stack cell, and the downstream open circuit voltage measuring portion measures the downstream open circuit voltage between the positive electrolyte inside the positive electrolyte return path, which is connected to one liquid separation plate out of the first liquid separation plate of the first sub-stack cell and the second liquid separation plate of the second sub-stack cell, and the negative electrolyte inside the negative electrolyte return path, which is connected to the other liquid separation plate. An inlet of the positive electrolyte inflow path and an inlet of the negative electrolyte inflow path and an outlet of the positive electrolyte outflow path and an outlet of the negative electrolyte outflow path are disposed so that a straight line that joins the inlets and a straight line that joins the outlets do not intersect. The upstream open circuit voltage measuring portion and the downstream open circuit voltage measuring portion are disposed on electrolyte flow paths between the inlets or the outlets and the positive electrode chamber or the negative electrode chamber.

A configuration that is not equipped with an open circuit voltage measuring unit may be used. That is, the first liquid separation plate of the first sub-stack cell and the second liquid separation plate of the second sub-stack cell may be disposed so that rear surfaces of the liquid separation plates contact one another, a first connecting hole that connects to the positive electrolyte inflow path may be formed in the rear surface of the second liquid separation plate of the second sub-stack cell, and a third connecting hole that connects to the negative electrolyte inflow path may be formed in the rear surface of the first liquid separation plate of the first sub-stack cell, a flow path that is one out of a second connecting hole that connects to the positive electrolyte outflow path, which is an upstream portion of the positive electrolyte return path, and a fourth connecting hole that connects to the negative electrolyte outflow path, which is an upstream portion of the negative electrolyte return path, may be formed in the first liquid separation plate of the first sub-stack cell, and a connecting hole that connects to another flow path may be formed in the second liquid separation plate of the second sub-stack cell, a first attachment member equipped with a first through-hole may be attached to the first connecting hole, a second attachment member equipped with a second through-hole may be attached to the second connecting hole, a third attachment member equipped with a third through-hole may be attached to the third connecting hole, and a fourth attachment member equipped with a fourth through-hole may be attached to the fourth connecting hole, the first connecting hole and the third connecting hole that are formed in different rear surfaces may be disposed at positions so that the first connecting hole and the third connecting hole are opposite one another when the cell stack has been assembled, the second connecting hole and the fourth connecting hole that are formed in different rear surfaces may be disposed at positions so that the second connecting hole and the fourth connecting hole are opposite one another when the cell stack has been assembled, each attachment member may be equipped with a reaction electrode that is disposed inside a through-hole and an electrode that contacts the reaction electrode, at least one of the first attachment member and the third attachment member may include a separator membrane of the upstream open circuit voltage measuring portion that is sandwiched between the reaction electrode of the first attachment member and the reaction electrode of the third attachment member, at least one of the second attachment member and the fourth attachment member may include a separator membrane of the downstream open circuit voltage measuring portion that is sandwiched between the reaction electrode of the second attachment member and the reaction electrode of the fourth attachment member, and when the cell stack is assembled, the upstream open circuit voltage measuring portion may be assembled by the first attachment member and the third attachment member and the downstream open circuit voltage measuring portion may be assembled by the second attachment member and the fourth attachment member.

Any of the redox flow batteries described above may further include a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation. The above controller controls the flow rate of electrolyte, the charging stopping operation, and the discharging stopping operation using the upstream open circuit voltage, the downstream open circuit voltage, and the voltage difference.

Another aspect of the present invention is a method of operating a redox flow battery that sends positive electrolyte, which has been sent out from a positive electrolyte storage tank, via a positive electrolyte inflow path to positive electrode chambers of cells in a cell stack, sends positive electrolyte, which has flowed out from the positive electrode chambers, via a positive electrolyte outflow path to the positive electrolyte storage tank, sends negative electrolyte, which has been sent out from a negative electrolyte storage tank, via a negative electrolyte inflow path to negative electrode chambers of the cells, and sends negative electrolyte, which has flowed out from the negative electrode chambers, via a negative electrolyte outflow path to the negative electrolyte storage tank, the method including controlling at least one of a flow rate of electrolyte, a charging stopping operation, and a discharging stopping operation using at least one of a voltage difference between an upstream open circuit voltage, which is measured between the positive electrolyte inside the positive electrolyte inflow path and the negative electrolyte inside the negative electrolyte inflow path, and a downstream open circuit voltage, which is measured between the positive electrolyte inside the positive electrolyte outflow path and the negative electrolyte inside the negative electrolyte outflow path, and the downstream open circuit voltage. This method of operation controls the flow rate of electrolyte, the charging stopping operation, and the discharging stopping operation using the upstream open circuit voltage, the downstream open circuit voltage, and the voltage difference.

Yet another aspect of the present invention is an open circuit voltage measuring unit used as at least one of the upstream open circuit voltage measuring unit and the downstream open circuit voltage measuring unit of the redox flow battery described above, wherein the open circuit voltage measuring unit includes: the open circuit voltage measuring portion which is housed inside the unit; a positive electrolyte circulation chamber; a negative electrolyte circulation chamber; a positive electrolyte inlet and a positive electrolyte outlet connected to the positive electrolyte circulation chamber; a negative electrolyte inlet and a negative electrolyte outlet connected to the negative electrolyte circulation chamber; and a connecting hole that connects the circulation chambers, and the open circuit voltage measuring portion includes: a separator membrane disposed at a position of the connecting hole; a first reaction electrode disposed in contact with the separator membrane on a positive electrolyte circulation chamber side; a second reaction electrode disposed in contact with the separator membrane on a negative electrolyte circulation chamber side; an electrode in contact with one of the reaction electrodes; and an electrode in contact with another of the reaction electrodes.

Yet another aspect of the present invention is a cell stack used in a redox flow battery that does not include the open circuit voltage measuring units described above. Yet another aspect of the present invention is a pair of liquid separation plates of a sub-stack cell used in the cell stack, wherein a third connecting hole that connects to the negative electrolyte inflow path is formed in the rear surface of the first liquid separation plate, a first connecting hole that connects to the positive electrolyte inflow path is formed in the rear surface of the second liquid separation plate, a flow path that is one out of a second connecting hole that connects to the positive electrolyte outflow path, which is an upstream portion of the positive electrolyte return path, and a fourth connecting hole that connects to the negative electrolyte outflow path, which is an upstream portion of the negative electrolyte return path, is formed in the first liquid separation plate, and a connecting hole that connects to another flow path is formed in the second liquid separation plate, a first attachment member equipped with a first through-hole is attached to the first connecting hole, a second attachment member equipped with a second through-hole is attached to the second connecting hole, a third attachment member equipped with a third through-hole is attached to the third connecting hole, and a fourth attachment member equipped with a fourth through-hole is attached to the fourth connecting hole, the first connecting hole and the third connecting hole are disposed at positions so that the first connecting hole and the third connecting hole become opposite one another when rear surfaces of the pair of liquid separation plates are placed in contact on top of one another, the second connecting hole and the fourth connecting hole are disposed at positions so that the second connecting hole and the fourth connecting hole become opposite one another when the rear surfaces of the pair of liquid separation plates are placed in contact on top of one another, each attachment member is equipped with a reaction electrode that is disposed inside a through-hole and an electrode that contacts the reaction electrode, at least one of the first attachment member and the third attachment member includes a separator membrane of the upstream open circuit voltage measuring portion that is sandwiched between the reaction electrode of the first attachment member and the reaction electrode of the third attachment member, and at least one of the second attachment member and the fourth attachment member includes a separator membrane of the downstream open circuit voltage measuring portion that is sandwiched between the reaction electrode of the second attachment member and the reaction electrode of the fourth attachment member.

The following configuration is also conceivable. As one example, a cell of a cell stack includes a separator membrane, positive electrode side and negative electrode side bipolar plates disposed on both sides of the separator membrane, a frame member that holds the separator membrane and both bipolar plates, a positive electrode disposed inside a positive electrode chamber between the separator membrane and the positive electrode-side bipolar plate, and a negative electrode disposed inside a negative electrode chamber between the separator membrane and the negative electrode-side bipolar plate, wherein the frame member includes a positive electrolyte inflow path that is a downstream portion of a positive electrolyte outward path and is connected to the positive electrode chamber, a positive electrolyte outflow path that is an upstream portion of a positive electrolyte return path and is connected to the positive electrode chamber, a negative electrolyte inflow path that is a downstream portion of a negative electrolyte outward path and is connected to the negative electrode chamber, and a negative electrolyte outflow path that is an upstream portion of a negative electrolyte return path and is connected to the negative electrode chamber, and further includes the upstream open circuit voltage measuring unit and the downstream open circuit voltage measuring unit. The frame member may include an inflow positive electrolyte flow splitting path that causes part of the positive electrolyte inside the positive electrolyte inflow path to flow to the upstream open circuit voltage measuring portion and then to the positive electrolyte outflow path, an inflow negative electrolyte flow splitting path that causes part of the negative electrolyte inside the negative electrolyte inflow path to flow to the upstream open circuit voltage measuring portion and then to the negative electrolyte outflow path, an outflow positive electrolyte flow splitting path that causes part of the positive electrolyte inside the positive electrolyte outflow path to flow to the downstream open circuit voltage measuring portion and then to the positive electrolyte outflow path, and an outflow negative electrolyte flow splitting path that causes part of the negative electrolyte inside the negative electrolyte outflow path to flow to the downstream open circuit voltage measuring portion and then to the negative electrolyte outflow path. The upstream end of the outflow positive electrolyte flow splitting path may be upstream of a downstream end of the outflow positive electrolyte flow splitting path and the downstream end of the inflow positive electrolyte flow splitting path, and the upstream end of the outflow negative electrolyte flow splitting path may be upstream of a downstream end of the outflow negative electrolyte flow splitting path and the downstream end of the inflow negative electrolyte flow splitting path. The frame member may include a pair of electrolyte frame portions, which hold the separator membrane, the bipolar plates and the electrode, and a pair of liquid separation plates that are disposed outside the respective electrolyte frame portions, and the liquid separation plates may include the positive electrolyte inflow path, the positive electrolyte outflow path, the negative electrolyte inflow path, the negative electrolyte outflow path, the upstream end and the downstream end of the inflow positive electrolyte flow splitting path, the upstream end and the downstream end of the inflow negative electrolyte flow splitting path, the upstream end and the downstream end of the outflow positive electrolyte flow splitting path, the upstream end and the downstream end of the outflow negative electrolyte flow splitting path, the upstream open circuit voltage measuring portion and the downstream open circuit voltage measuring portion. A cell of a cell stack, the cell stack being used in a redox flow battery, may include: a separator membrane; positive electrode side and negative electrode side bipolar plates disposed on both sides of the separator membrane; a frame member that holds the separator membrane and both bipolar plates; a positive electrode disposed in a positive electrode chamber between the separator membrane and the positive electrode-side bipolar plate; and a negative electrode disposed in a negative electrode chamber between the separator membrane and the negative electrode-side bipolar plate, wherein the frame member includes a positive electrolyte inflow path that is a downstream portion of a positive electrolyte outward path and is connected to the positive electrode chamber, a positive electrolyte outflow path that is an upstream portion of a positive electrolyte return path and is connected to the positive electrode chamber, a negative electrolyte inflow path that is a downstream portion of a negative electrolyte outward path and is connected to the negative electrode chamber, and a negative electrolyte outflow path that is an upstream portion of a negative electrolyte return path and is connected to the negative electrode chamber, and also the upstream open circuit voltage measuring unit and the downstream open circuit voltage measuring unit. The frame member used in this cell stack may include a pair of electrolyte frame portions, which hold the separator membrane, bipolar plates, and electrodes, and a pair of liquid separation plates, which are disposed on the outside of the electrolyte frame portions. The liquid separation plates used in the frame members used in the cell stack may include the positive electrolyte inflow path, the positive electrolyte outflow path, the negative electrolyte inflow path, the negative electrolyte outflow path, the upstream open circuit voltage measuring unit, and the downstream open circuit voltage measuring unit.

Effect of the Invention

With the redox flow battery according to an embodiment of the present invention, since it is possible to detect the downstream open circuit voltage measured by the downstream open circuit voltage measuring portion and it is possible to know the charging/discharging state of the electrolyte inside the cell stack using the voltage difference, it is possible to realize stabilized operation of a redox flow battery and also possible to improve the efficiency of the battery.

NUMERICAL REFERENCES

Figure 1:
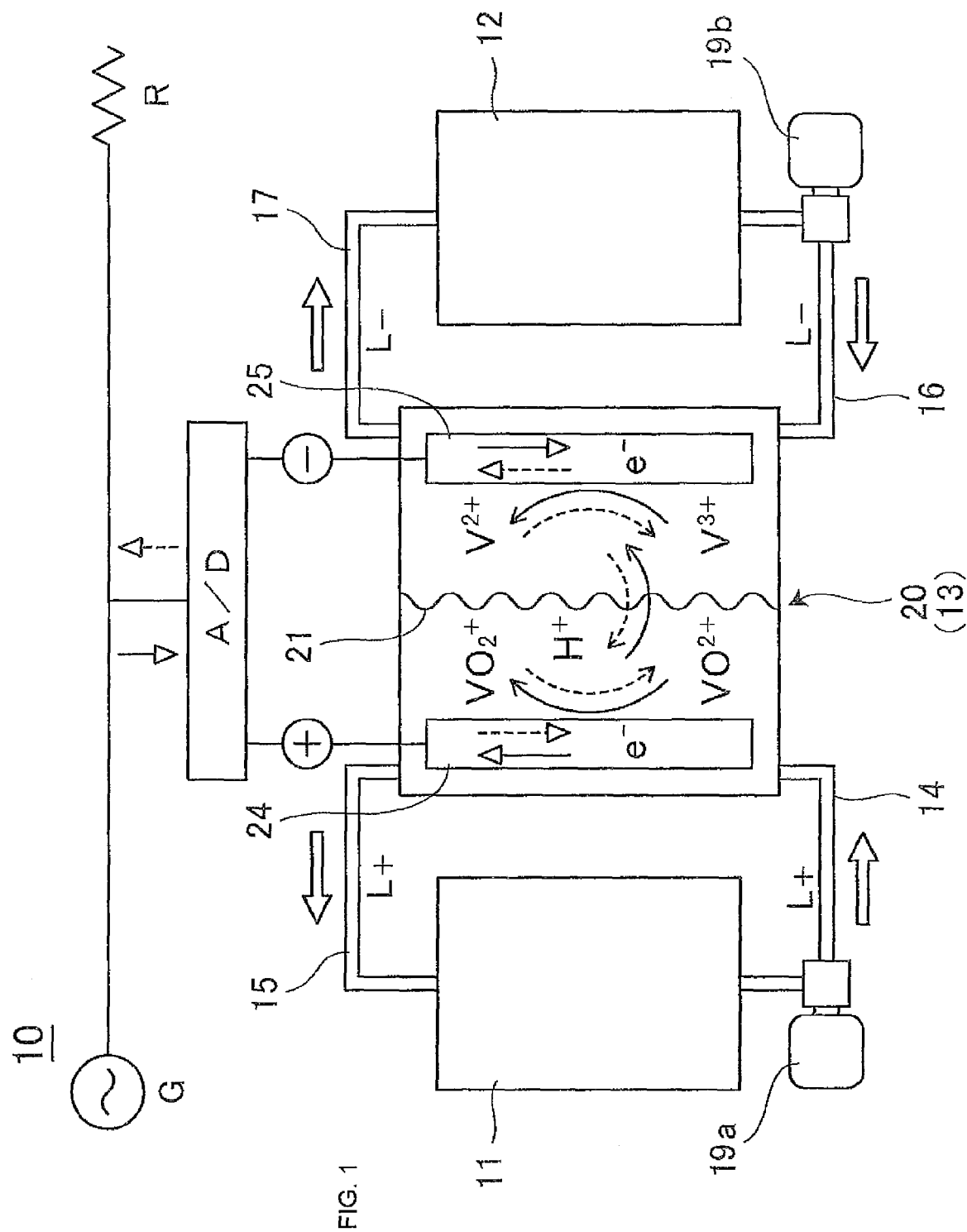
FIG. 1 is a schematic diagram useful in explaining the configuration and principles of a redox flow battery.

10—redox flow battery
11—positive electrolyte tank (positive electrolyte storage tank)
12—negative electrolyte tank (negative electrolyte storage tank)
13—cell stack
14—positive electrolyte outward piping (upstream portion of positive electrolyte outward path)
14a—positive electrolyte inflow path (downstream portion of positive electrolyte outward path)
15—positive electrolyte return piping (downstream portion of positive electrolyte return path)
15a—positive electrolyte outflow path (upstream portion of positive electrolyte return path)
16—negative electrolyte outward piping (upstream portion of negative electrolyte outward path)
16a—negative electrolyte inflow path (downstream portion of negative electrolyte outward path)
17—negative electrolyte return piping (downstream portion of negative electrolyte return path)
17a—negative electrolyte outflow path (upstream portion of negative electrolyte return path)
18a—inflow positive electrolyte flow splitting path (flow path that causes part of electrolyte on the positive electrolyte inflow path to flow to the upstream open circuit voltage measuring portion and then to the positive electrolyte outflow path)
18b—inflow negative electrolyte flow splitting path (flow path that causes part of electrolyte on the negative electrolyte inflow path to flow to the upstream open circuit voltage measuring portion and then returns electrolyte to the negative electrolyte outflow path)
18c—outflow positive electrolyte flow splitting path (flow path that causes part of electrolyte that has flowed out from the positive electrode chamber into the positive electrolyte outflow path to flow to the downstream open circuit voltage measuring portion and then returns the electrolyte to the positive electrolyte outflow path)
18d—outflow negative electrolyte flow splitting path (flow path that causes part of electrolyte that has flowed out from the negative electrode chamber into the negative electrolyte inflow path to flow to the downstream open circuit voltage measuring portion and then returns the electrolyte to the negative electrolyte outflow path)
19a, 19b—pumps
20—cells (circulation-type electrolysis cells)
21—separator membrane
21a, 21b, 21c, 21d, 21e—through-hole
22, 22a, 22b—bipolar plate
24—positive electrode
25—negative electrode
30—frame member
31—frame pieces
31a—positive electrode chamber
32a—negative electrode chamber
40—first electrolyte frame
41—introducing path (positive electrolyte introducing path)
42—positive electrolyte emissary path
43—through-hole
44—flow splitting hole
45, 46, 47—through-hole
50—first liquid separation plate
51—positive electrolyte outflow path downstream portion
51a—entrance
51b—flow splitting hole
52—positive electrolyte outlet
53—negative electrolyte inlet
54—negative electrolyte inflow path upstream portion
54b—outlet
56—return path
56a—inlet
56b—outlet
57—flow splitting hole
58—return path
58b—outlet
59a, 59b, 59c, 59d—connecting hole
60—second electrolyte frame
61a—through-hole
63—introducing path (negative electrolyte introducing path)
64—negative electrolyte emissary path
67—through-hole
65—flow splitting hole
66, 67—through-hole
70—second liquid separation plate
71—positive electrolyte inlet
72—positive electrolyte inflow path upstream portion
73—outlet
74—negative electrolyte outflow path downstream portion
74a—inlet
75—negative electrolyte outlet
76—return path
76a—inlet
76b—outlet
77—return path
77a—inlet
77b—outlet 80—entrance open circuit voltage measuring unit
81—miniaturized cell (entrance open circuit voltage measuring portion, upstream open circuit voltage measuring portion)
82—positive electrolyte flow path
82a—inlet
82b—outlet
83—negative electrolyte flow path
83a—inlet
83b—outlet
90—exit open circuit voltage measuring unit
91—miniaturized cell (exit open circuit voltage measuring portion, downstream open circuit voltage measuring portion)
92—positive electrolyte flow path
92a—inlet
92b—outlet
93—negative electrolyte flow path
93a—inlet
93b—outlet
A/D—DC/AC convertor
G—generator
L+—positive electrolyte (electrolyte on positive electrode side)
L−—negative electrolyte (electrolyte on negative electrode side)
R—load
Vin—entrance open circuit voltage
Vout—exit open circuit voltage
13a—cell stack
14b, 16c—inlet
15c, 17b—outlet
20a, 20b—cell
49—pressing plate
50a—first liquid separation plate
50f—side end surface
70a—second liquid separation plate
70f—side end surface
80a—entrance open circuit voltage measuring unit
84—positive electrolyte flow chamber
84a—positive electrolyte inlet
84b—positive electrolyte outlet
84d—slit opening portion (gap portion)
84x—connecting hole
85—negative electrolyte flow chamber
85a—negative electrolyte inlet
85b—negative electrolyte outlet
85d—slit opening portion (gap portion)
86—measuring cell portion (upstream open circuit voltage measuring portion)
86a—separator membrane
86b—frame member
86c—reaction electrode
86d—electrode
86e—electrode holding portion
86f—dam portion
90a—exit open circuit voltage measuring unit
13b cell stack
20c, 20d—sub-cell stack
50b first liquid separation plate
50c, 50d—concave portion
50e, 50f—connecting hole
50y—rear surface
70b—second liquid separation plate
70c, 70d—concave portion
70e, 70f—connecting hole
70y rear surface
87a first attachment member
87b second attachment member
87c third attachment member
87d—fourth attachment member
87e—main body of attachment member
87f—protruding portion
87h—electrode
87i—reaction electrode
87j—holding portion
87k—separator membrane
89a—89d—through-hole

BEST MODE FOR CARRYING OUT THE INVENTION

Embodiments of a redox flow battery according to the present invention will now be described.
First Embodiment
As depicted in FIG. 1, a redox flow battery (hereinafter sometimes referred to simply as the "battery") 10 according to the present embodiment is equipped with a positive electrolyte tank (positive electrolyte storage tank) 11 in which electrolyte for the positive electrode (hereinafter "positive electrolyte") L+ is stored, a negative electrolyte tank (negative electrolyte storage tank) 12 in which electrolyte for the negative electrode (hereinafter "negative electrolyte") L− is stored, a cell stack 13 (see FIG. 2), positive electrode outward piping (an upstream portion of a positive electrolyte outward path) 14 that sends the positive electrolyte L+ sent out of the positive electrolyte tank 11 to the cell stack 13, positive electrode return piping (a downstream portion of the positive electrolyte return path) 15 that returns the positive electrolyte L+ that has flowed out of the cell stack 13 to the positive electrolyte tank 11, negative electrode outward piping (an upstream portion of the negative electrolyte outward path) 16 that sends the negative electrolyte L-sent out of the negative electrolyte tank 12 to the cell stack 13, negative electrode return piping (a downstream portion of the negative electrolyte return path) 17 that returns the negative electrolyte L− that has flowed out of the cell stack 13 to the positive electrolyte tank 12, pumps 19a and 19b for pumping electrolyte through such piping (electrolyte flow paths), and a controller (not illustrated) that controls the flowrate of electrolyte and the charging/discharging state. Note that since the principles of the redox flow battery according to the present embodiment are known principles, detailed description thereof is omitted here.

Figure 2:
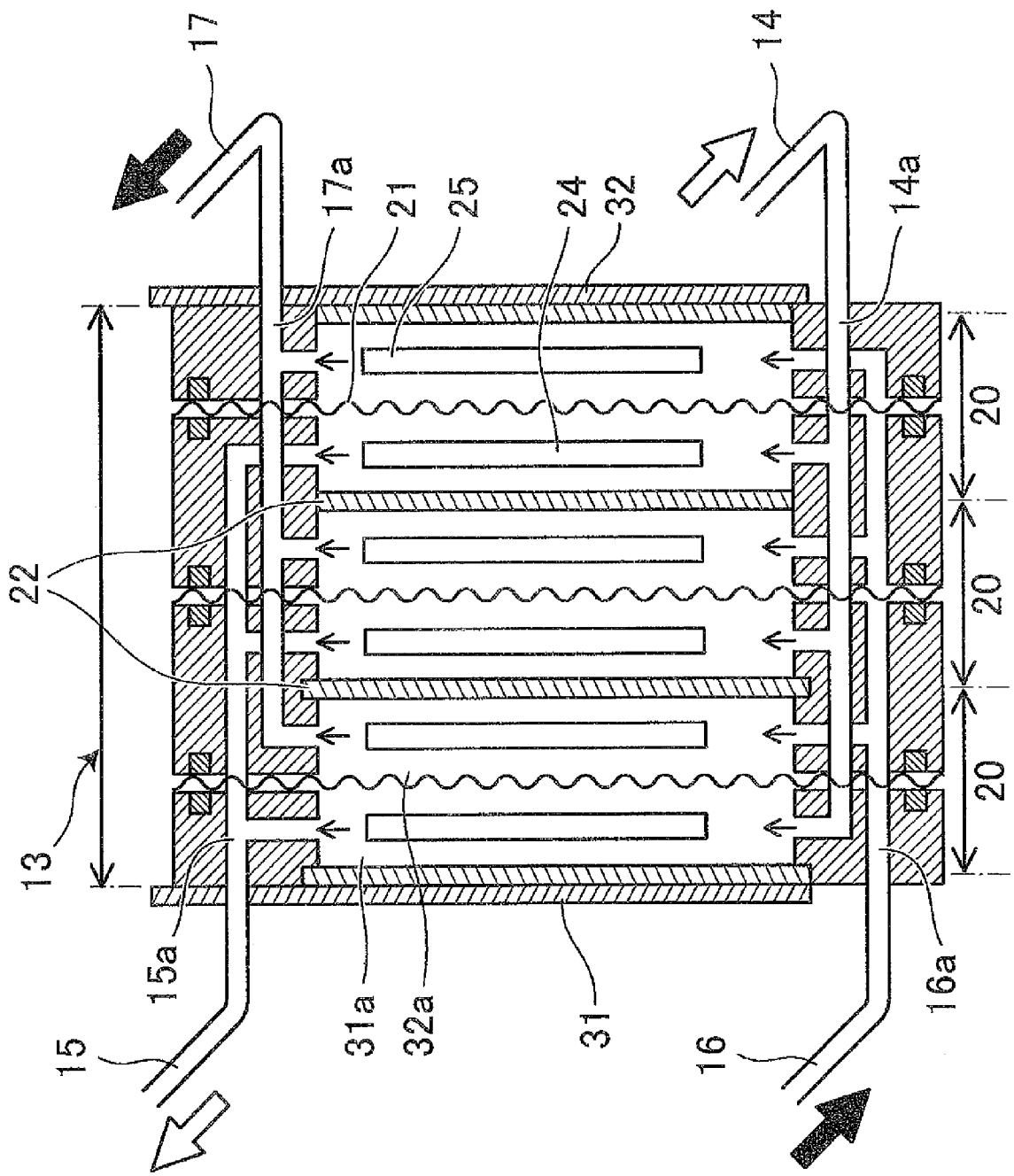
FIG. 2 is a schematic diagram useful in explaining the configuration of a cell stack of a redox flow battery according to a first embodiment of the present invention.
Figure 3:
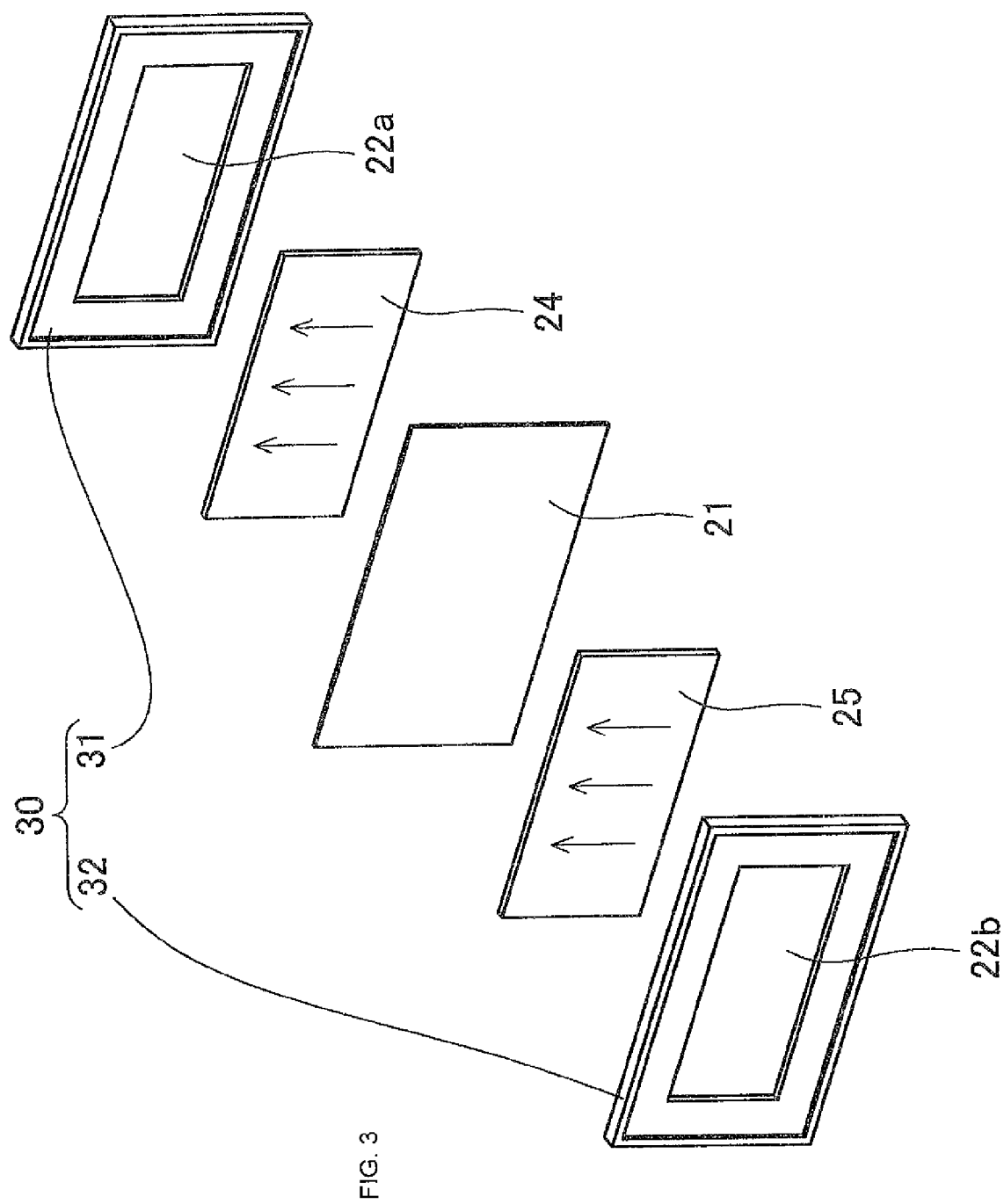
FIG. 3 is an exploded perspective view to facilitate explanation of the configuration of the cell stack depicted in FIG. 2.

As depicted in FIG. 2, the cell stack 13 has a plurality of circulation—type electrolysis cells (hereinafter simply referred to as "cells") 20, in which a cell reaction is carried out, stacked together. The cells 20 respectively include a separator membrane 21, bipolar plates 22 disposed on both sides of the separator membrane 21, a positive electrode 24, a negative electrode 25, and a frame member 30. As depicted in FIG. 3, the frame member 30 includes a pair of frame pieces 31 and 32 that sandwich the separator membrane 21.

Figure 4:
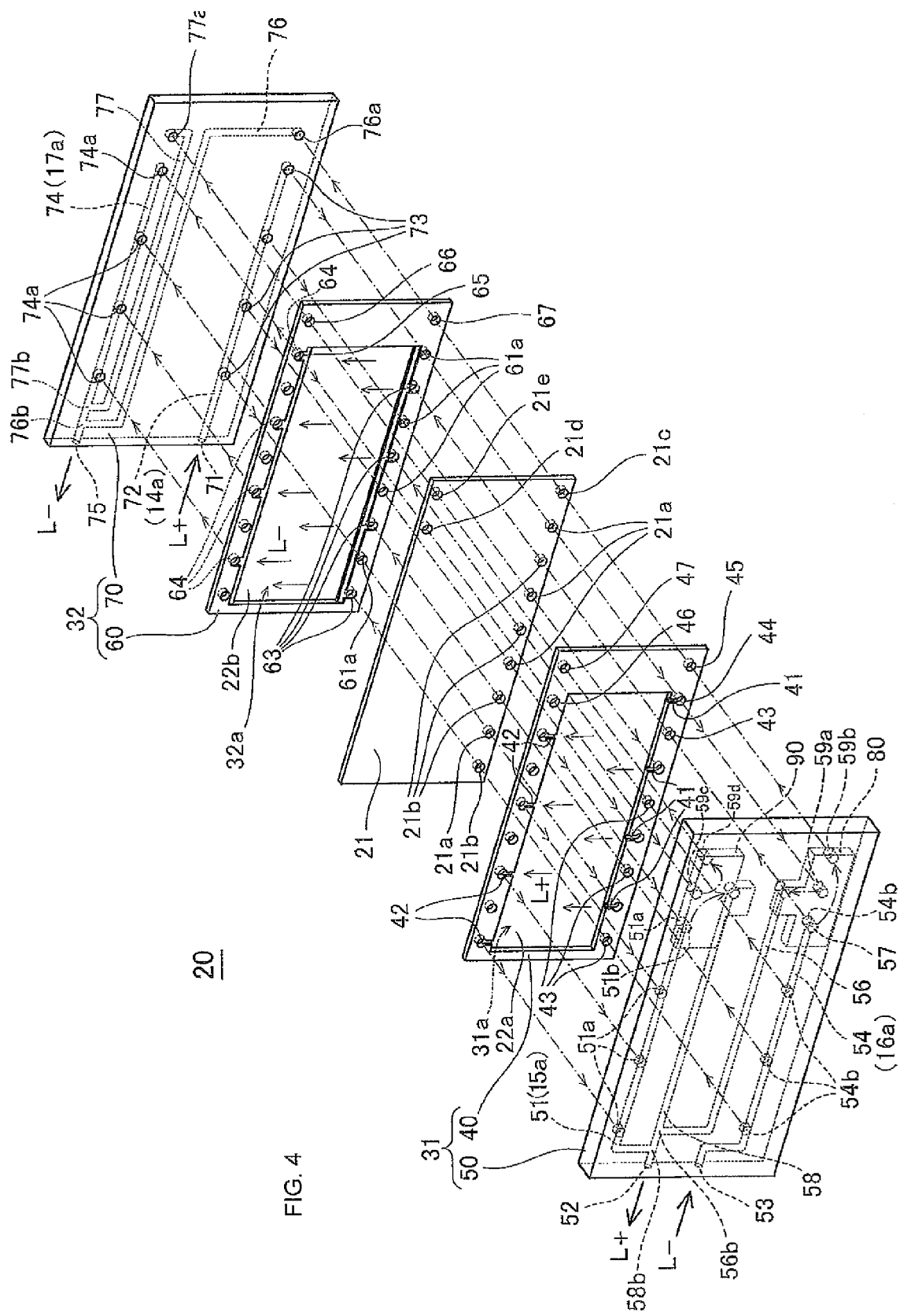
FIG. 4 is a perspective view useful in explaining liquid separation plates of a cell that constructs a cell stack.

As depicted in FIG. 4, the first frame piece 31 positioned on the positive electrode side of the cell 20 is constructed of a first electrolyte frame 40 that contacts the separator membrane 21 and a first liquid separation plate 50 disposed on the outside of the first electrolyte frame 40, and the second frame piece 32 positioned on the negative electrode side of the cell 20 is constructed of a second electrolyte frame 60 that contacts the separator membrane 21 and a second liquid separation plate 70 disposed on the outside of the second electrolyte frame 60. The positive electrode-side bipolar plate 22a of the cell 20 is integrally attached to the inside of the first electrolyte frame 40 and the negative electrode-side bipolar plate 22b of the cell 20 is integrally attached to the inside of the second electrolyte frame 60. A positive electrode-side positive electrode chamber 31a and a negative electrode-side negative electrode chamber 32a are formed between the frame pieces 31 and 32 to which the bipolar plates 22a and 22b are integrally attached and the separator membrane 21 (see FIG. 2), with the positive electrode 24 disposed inside the positive electrode chamber 31a and the negative electrode 25 disposed inside the negative electrode chamber 32a. Note that although the electrodes 24 and 25 are depicted in FIG. 2 as being disposed in the centers of the positive electrode chamber 31a and the base end unit 32b and wiring and the like is not illustrated out of convenience to illustrate the electrodes 24 and 25, in reality the electrodes 24 and 25 are connected to the separator membrane 21 and on the opposite side to the bipolar plates 22a and 22b so that the cells 20 are stacked, which makes it possible to raise the voltage. The electrodes 24 and 25 are connected via a DC/AC convertor A/D (see FIG. 1) to an AC power system (a generator G and/or a load L) to enable charging and discharging. The DC/AC convertor A/D is equipped with a circuit switch (not illustrated) for switching between a connected state and a disconnected state (cutoff state). During charging and discharging, the switch is turned on to produce a state where power can flow. During charging, power generated by the generator G or the like is stored in the electrolyte inside the cell stack 13 and during discharging, power is supplied from the electrolyte inside the cell stack 13 to the load R of the electrical system. Note that to illustrate the configuration of the cell 20 of the cell stack 13 more clearly, only one out of the plurality of cells 20 that construct the cell stack 13 is depicted.

As depicted in FIG. 4, flow paths (or "manifolds") that allow electrolyte to circulate are formed in the electrolyte frames 40 and 60, the liquid separation plates 50 and 70, and the separator membrane 21 that construct a cell 20. That is, a positive electrolyte inflow path 14a that connects to the positive electrode chamber 31a and is a downstream portion of the positive electrolyte outward path), a positive electrolyte outflow path 15a that connects the positive electrode chamber 31a and is an upstream portion of the positive electrolyte return path), a negative electrolyte inflow path 16a that connects to the negative electrode chamber 32a and is a downstream portion of the negative electrolyte outward path), and a negative electrolyte outflow path 17a that connects to the negative electrode chamber 32a and is an upstream portion of the positive electrolyte return path) are formed in the members 21, 40, 50, 60, and 70.

The positive electrolyte inflow path 14a is a flow path that sends the positive electrolyte L+ that has flowed from the positive electrolyte tank 11 into the frame member 30 to the positive electrode chamber 31a, and as depicted in FIG. 4, is equipped with a positive electrolyte inflow path upstream portion 72 that connects to a positive electrolyte inlet 71 that is furthest upstream and is formed in the second liquid separation plate 70, through-holes 61a that are formed in the second electrolyte frame 60 and are connected to outlets 73 on a downstream side, through-holes 21a that are formed in the separator membrane 21 and are connected to the through-holes 61a, and an introducing path (positive electrolyte introducing path) 41 into the positive electrode chamber 31a that is formed in the first electrolyte frame 40 and is connected to the through-holes 21a. Since the positive electrolyte inflow path upstream portion 72, the through-holes 61a and 21a, and the introducing path 41 are connected to form the positive electrolyte inflow path 14a, when the redox flow battery 10 is operating, the positive electrolyte L+ that has flowed from the positive electrolyte inlet 71 into the frame member 30 flows via this inflow path 14a into the positive electrode chamber 31a. Note that a flow splitting hole 44, described later, is formed in an outside (first liquid separation plate 50 side) of one of the plurality of introducing paths 41 (the introducing path 41 positioned furthest downstream). Part of the electrolyte L+ that has flowed on the positive electrolyte inflow path 14a is diverted via this flow splitting hole 44 to an entrance open-circuit voltage measuring unit 80, described later. Through-holes do not need to be provided on the outsides of the introducing paths 41 aside from the introducing path 41 positioned furthest downstream. The positive electrolyte outflow path 15a is a flow path that sends the positive electrolyte L+ that has flowed out of the positive electrode chamber 31a to the positive electrolyte return piping 15, and is equipped with an introducing path (positive electrolyte emissary path) 42, which is formed in the first electrolyte frame 40 and is connected to an outlet of the positive electrode chamber 31a, and a positive electrolyte outflow path downstream portion 51, which is formed in the first liquid separation plate 50 and is connected to the introducing path 42. Out of such elements, the positive electrolyte outflow path downstream portion 51 is connected to the introducing path 42 at an inlet 51a thereof. Since the positive electrolyte emissary path 42 and the positive electrolyte outflow path downstream portion 51 are connected to form the positive electrolyte outflow path 15a, when the redox flow battery 10 is operating, the positive electrolyte L+ that has flowed out of the positive electrode chamber 31a flows out via this flow path 15a from the outlet 52 at the downstream end of the positive electrolyte outflow path downstream portion 51 to the positive electrode return piping 15 on the outside of the frame member 30. Note that a flow splitting hole 51b, described later, that allows positive electrolyte to flow to the outside (toward an exit open circuit voltage measuring unit 90, described later) is formed in an upstream portion (a position of the inlet 51a that is furthest upstream) of the positive electrolyte outflow path downstream portion 51. Part of the electrolyte L+ that has flowed out from the positive electrode chamber 31a is diverted via this flow splitting hole 51b toward the exit open circuit voltage measuring unit 90.

The negative electrolyte inflow path 16a is a flow path that sends the negative electrolyte L− that has flowed from the negative electrolyte tank 12 into the frame member 30 to the negative electrode chamber 32a, and is equipped with a negative electrolyte inflow path upstream portion 54 that connects to a negative electrolyte inlet 53 that is furthest upstream and is formed in the first liquid separation plate 50, through-holes 43 that are formed in the first electrolyte frame 40 and are connected to outlets 54b of the negative electrolyte inflow path upstream portion 54, through-holes 21b that are formed in the separator membrane 21 and are connected to the through-holes 43, and an introducing path (negative electrolyte inflow path) 63 into the negative electrode chamber 32a that is formed in the second electrolyte frame 60 and is connected to the through-holes 21b. Since the negative electrolyte inflow path upstream portion 54, the through-holes 43 and 21b, and the introducing path 63 are connected to form the negative electrolyte inflow path 16a, when the redox flow battery 10 is operating, the positive electrolyte L+ that has flowed from the negative electrolyte inlet 53 into the frame member 30 flows via this flow path 16a into the negative electrode chamber 32a. Note that a flow splitting hole 57, described later, that allows the negative electrolyte to flow to the outside (toward the entrance open circuit voltage measuring unit 80, described later) is formed in a downstream portion (a position of the outlet 54b positioned furthest downstream) of the negative electrolyte inflow path upstream portion 54. Part of the negative electrolyte L− that has flowed on the negative electrolyte inflow path 16a is diverted via this flow splitting hole 57 toward the entrance open-circuit voltage measuring unit 80, described later. The negative electrolyte outflow path 17a is a flow path that sends the negative electrolyte L− that has flowed out from the negative electrode chamber 32a to the negative electrode return piping 17, and is equipped with an emissary path (negative electrolyte emissary path) 64, which is formed in the second electrolyte frame 60 and is connected to the outlet of the negative electrode chamber 32a, and a negative electrolyte outflow path downstream portion 74, which is formed in the second liquid separation plate 70 and is connected to the emissary path 64. Since the emissary path 64 and the negative electrolyte outflow path downstream portion 74 that is connected via an inlet 74a to the emissary path 64 form the negative electrolyte outflow path 17a, when the redox flow battery 10 is operating, the negative electrolyte L− that has flowed out from the negative electrode chamber 32a flows out from an outlet 75 at the downstream end of the negative electrolyte outflow path downstream portion 74 via this inflow path 17a into the negative electrode return piping 17 outside the frame member 30. Note that a flow splitting hole 65, described later, is formed inside (i.e., on the separator membrane 21 side of) one out of the plurality of emissary paths 64 (the emissary path 64 that is positioned furthest upstream). Part of the negative electrolyte L− that has flowed out from the negative electrode chamber 32a is diverted via this flow splitting hole 65 toward the exit open circuit voltage measuring unit 90.

The frame member 30 is also equipped with the entrance open circuit voltage measuring unit (entrance open circuit voltage measuring portion) 80 and the exit open circuit voltage measuring unit (exit open circuit voltage measuring portion) 90 for measuring open circuit voltages, and a flow splitting paths (manifolds) that circulate the electrolyte toward the respective voltage measuring units 80 and 90. More specifically, the first liquid separation plate 50 of the frame member 30 is equipped with the respective voltage measuring units 80 and 90. Note that the entrance open circuit voltage measuring unit 80 measures the entrance open circuit voltage (upstream open circuit voltage) that is the potential difference between the electrolyte inside the positive electrolyte inflow path 14a and the electrolyte inside the negative electrolyte inflow path 16a. The exit open circuit voltage measuring unit 90 measures the exit open circuit voltage (downstream open circuit voltage) that is the potential difference between the electrolyte inside the positive electrolyte outflow path 15a and the electrolyte inside the negative electrolyte outflow path 17a.

Figure 5:
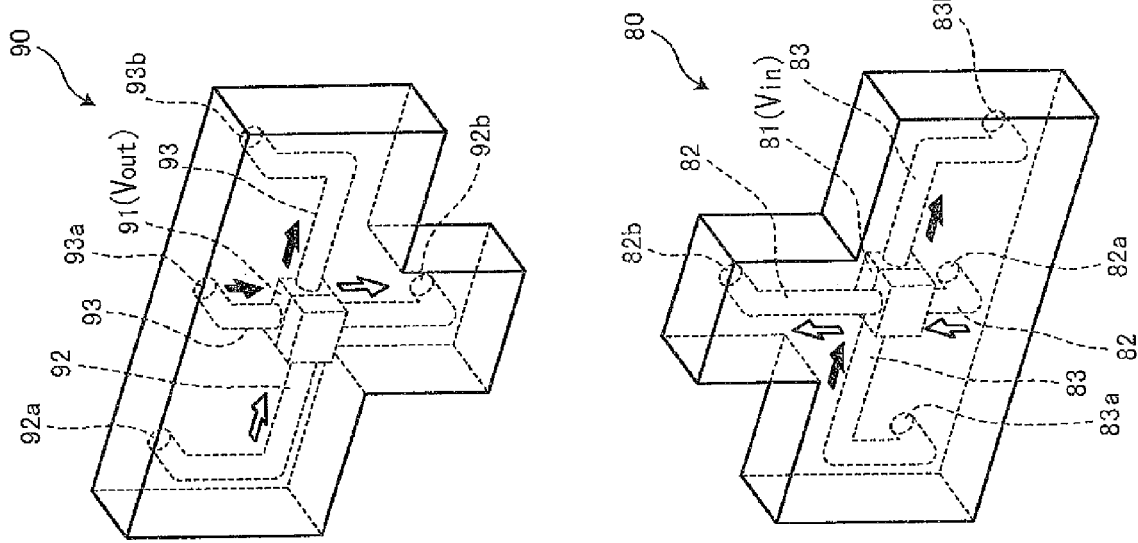
FIG. 5 is a perspective view useful in explaining voltage measuring units incorporated in a liquid separation plate depicted in FIG. 4.

As depicted in FIG. 5, the entrance open circuit voltage measuring unit 80 is equipped with a miniaturized cell (entrance open circuit voltage measuring portion) 81 housed inside the unit, a positive electrolyte flow path 82, and a negative electrolyte flow path 83. The positive electrolyte flow path 82 is a flow path that causes positive electrolyte L+, which has entered the positive electrolyte flow path 82 from an inlet 82a, flow into the miniaturized cell 81 and then causes positive electrolyte L+ that has flowed out from the miniaturized cell 81, to flow from an outlet 82b to outside the unit 80. The negative electrolyte flow path 83 is a flow path that causes negative electrolyte L−, which has entered the negative electrolyte flow path 83 from an inlet 83a, to flow into the miniaturized cell 81 and then causes negative electrolyte L− that has flowed out from the miniaturized cell 81 to flow from an outlet 83b to outside the unit 80. In the same way, the exit open circuit voltage measuring unit 90 is equipped with a miniaturized cell 91 housed inside the unit, a negative electrolyte flow path 92, an inlet 92a and an outlet 92b of the same, a positive electrolyte flow path 93, and an inlet 93a and outlet 93b of the same. Note that the miniaturized cells 81 and 91 are known configurations. That is, the miniaturized cells 81 and 91 are constructed for example by miniaturizing the cells 20 described above, and are capable of measuring the potential difference (voltage) between a positive electrode disposed in the positive electrode chamber 31a to which the positive electrolyte L+ circulates and a negative electrode disposed in the negative chamber 32a to which the negative electrolyte L− circulates. In this way, the miniaturized cells 81 and 91 can use the same basic configuration as the cells 20. In the present embodiment, detailed description of configurations such as the wiring between the electrodes and the voltage measuring units is omitted.

In more detail, the frame member 30 includes flow splitting paths, that is, an inflow positive electrolyte flow splitting path 18a, an inflow negative electrolyte flow splitting path 18b, an outflow positive electrolyte flow splitting path 18c, and an outflow negative electrolyte flow splitting path 18d, that circulate electrolyte toward the voltage measuring units 80 and 90.

The inflow positive electrolyte flow splitting path 18a is a path that causes part of the electrolyte inside the positive electrolyte inflow path 14a to flow toward the entrance open circuit voltage measuring unit 80 and then to the positive electrolyte outflow path 15a. The flow splitting path 18a is equipped with the flow splitting hole 44 formed in the first electrolyte frame 40, a connecting hole 59a formed in the first liquid separation plate 50, the positive electrolyte flow path 82 (see FIG. 5) of the entrance open circuit voltage measuring unit 80, and a return path 56 formed inside the first liquid separation plate 50, which are connected. Out of such elements, the flow splitting hole 44 is formed in the outside (the first liquid separation plate 50 side) of the introducing path 41 so as to be connected to the introducing path 41. The downstream side (outside) of the flow splitting hole 44 is connected to the inlet 82a of the positive electrolyte flow path 82. The return path 56 has an inlet on the upstream side that is connected to the outlet 82b of the positive electrolyte flow path 82 and an outlet 56b on the downstream side that is connected to a return path 58, described later. However, as described later, an outlet 58b of the return path 58 is connected to the positive electrolyte outflow path downstream portion 51 and positive electrolyte that has flowed through the return path 56 flows first into the return path 58 and then passes through the outlet 58b and flows out from the detected object 52 to the outside. That is, the exit of the return path 56 to the positive electrolyte outflow path downstream portion 51 is effectively the outlet 58b. The positive electrolyte L+ that has flowed from the positive electrolyte inflow path 14a into the flow splitting hole 44 during the operation of the battery passes through the flow splitting path 18a via the miniaturized cell 81 located midway on the flow splitting path 18a and flows out to the positive electrolyte outflow path downstream portion 51. The inflow negative electrolyte flow splitting path 18b is a path that causes part of the electrolyte in the negative electrolyte inflow path 16a to flow toward the entrance open circuit voltage measuring unit 80 and then returns the electrolyte to the negative electrolyte outflow path 17a. The flow splitting path 18b is equipped with the flow splitting hole 57 formed in a downstream portion (the position of the outlet 54b positioned furthest downstream) of the negative electrolyte inflow path upstream portion 54, the negative electrolyte flow path 83 (see FIG. 5) of the entrance open circuit voltage measuring unit 80, a connecting hole 59b formed in the first liquid separation plate 50, a through-hole 45 formed in the first electrolyte frame 40, a through-hole 21c formed in the separator membrane 21, a through-hole 67 formed in the second electrolyte frame 60, and a return path 76 formed inside the second liquid separation plate 70, which are connected. Out of such elements, the return path 76 has an inlet 76a on the upstream side connected to the through-hole 67 and an outlet 76b on the downstream side connected to the negative electrolyte outflow path downstream portion 74. The negative electrolyte L− that has flowed from the negative electrolyte inflow path 16a into the flow splitting hole 57 during operation of the battery passes through the flow splitting path 18b via the miniaturized cell 81 located midway on the flow splitting path 18b and flows out to the negative electrolyte outflow path downstream portion 74.

The outflow positive electrolyte flow splitting path 18c is a path that causes part of the electrolyte inside the positive electrolyte outflow path 15a that has flowed out from the positive electrode chamber 31a to flow toward the exit open circuit voltage measuring unit 90 and then returns the electrolyte to the positive electrolyte outflow path 15a. The flow splitting path 18c is equipped with the flow splitting hole 51b formed in the upstream side (the position of the inlet 51a positioned furthest upstream) of the positive electrolyte outflow path downstream portion 51, the positive electrolyte flow path 92 of the exit open circuit voltage measuring unit 90, and the return path 58 formed in the first liquid separation plate 50, which are connected. Note that the positive electrolyte flow path 92 has an inlet 92a connected to the flow splitting hole 51b and an outlet 92b connected to the return path 58. The positive electrolyte L+ that has flowed from the positive electrolyte outflow path 15a into the flow splitting hole 51b during the operation of the battery passes through the flow splitting path 18c via the miniaturized cell 91 located midway on the flow splitting path 18c and returns to the positive electrolyte outflow path downstream portion 51. The outflow negative electrolyte flow splitting path 18d is a path that causes part of the electrolyte inside the negative electrolyte outflow path 17a that has flowed out from the negative electrode chamber 32a to flow toward the exit open circuit voltage measuring unit 90 and then returns the electrolyte to the negative electrolyte outflow path 17a. The flow splitting path 18d is equipped with the flow splitting hole 65 formed in the second electrolyte frame 60, a through-hole 21d formed in the separator membrane 21, a through-hole 46 formed in the first electrolyte frame 40, a connecting hole 59c formed in the first liquid separation plate 50, the negative electrolyte flow path 93 of the exit open circuit voltage measuring unit 90, a connecting hole 59d formed in the first liquid separation plate 50, a through-hole 47 formed in the first electrolyte frame 40, a through-hole 21e formed in the separator membrane 21, a through-hole 66 formed in the second electrolyte frame 60, and a return path formed in the second liquid separation plate 70, which are connected. Out of such elements, the flow splitting hole 65 is formed on an inside (the separator membrane 21 side) of the emissary path 64 so as to be connected to the emissary path 64. The downstream side (inside) of the flow splitting hole 65 is connected to the through-hole 21e. The return path 77 is connected to the through-hole 66 by an inlet 77a on the upstream side and is connected to the negative electrolyte outflow path downstream portion 74 by an outlet 77b on the downstream side. The negative electrolyte L− that has flowed from the negative electrolyte outflow path 17a into the flow splitting hole 65 during operation of the battery passes through the flow splitting path 18d via the miniaturized cell 91 located midway on the flow splitting path 18d and returns to the negative electrolyte outflow path downstream portion 74.

However, as described above, the entrance of the inflow positive electrolyte flow splitting path 18a is the flow splitting hole 44 of the first electrolyte frame 40 and the exit (the position of confluence with the positive electrolyte outflow path downstream portion 51) is effectively the outlet 58b of the return path 58 as described above. The entrance to the inflow negative electrolyte flow splitting path 18b is the flow splitting hole 57 of the first liquid separation plate 50 and the exit (the position of confluence with the negative electrolyte outflow path downstream portion 74) is the outlet 76b of the return path 76 of the second liquid separation plate 70. The entrance to the outflow positive electrolyte flow splitting path 18c is the flow splitting hole 51b of the first liquid separation plate 50 and the exit (the position of confluence with the positive electrolyte outflow path downstream portion 51) is the outlet 58b of the return path 58 of the first liquid separation plate 50. The entrance to the outflow negative electrolyte flow splitting path 18d is the flow splitting hole 65 of the second electrolyte frame 60 and the exit (the position of confluence with the negative electrolyte outflow path downstream portion 74) is the outlet (confluence position) 77b of the return path 77 of the second liquid separation plate 70. By comparing the positions of the flow splitting hole 51b that is the confluence position for the positive electrolyte outflow path downstream portion 51 (that is, the positive electrolyte outflow path 15a) and the outlet 58b based on the flow of positive electrolyte in the positive electrolyte outflow path downstream portion 51, the flow splitting hole 51b is further upstream than the outlet 58b. Note that by comparing based on the flow directions of electrolyte on the return path 58, the outlet 56b of the return path 56 is further upstream than the outlet 58b of the return path 58. By comparing the positions of the flow splitting hole 65 that is the position of confluence with the negative electrolyte outflow path downstream portion 74 (that is, the negative electrolyte outflow path 17a), the outlet 76b of the return path 76, and the outlet 77b of the return path 77 based on the flow of the negative electrolyte in the negative electrolyte outflow path downstream portion 74, the flow splitting hole 65, the outlet 77b of the return path 77, and the outlet 76b of the return path 76 are positioned in that order from the upstream side in the direction of flow of the negative electrolyte outflow path downstream portion 74. By using this layout, a smoother flow of electrolyte is realized. Note that FIGS. 2 to 5 are diagrams intended to facilitate understanding of the action of the respective elements (such as flow paths) that are illustrated, and do not accurately depict the actual ratios between dimensions. For example, the sizes (such as diameters) of the flow paths formed in the liquid separation plates 50 and 70 and the like may be decided as appropriate with consideration to the flow rate of electrolyte, flow resistance, pressure gradient, and the like when designing the redox flow battery.

With the battery 10 configured as described above, when the pumps 19a and 19b are operated, the positive electrolyte L+ that has flowed out of the positive electrolyte tank 11 flows via the positive electrode outward piping of the positive electrolyte outward path to the respective cells 20 of the cell stack 13. The positive electrolyte L+ that has flowed into the cell stack 13 flows through the positive electrolyte inflow path 14a of the frame member 30 into the positive electrode chamber 31a. After this, the positive electrolyte L+ that has flowed out from the positive electrode chamber 31a flows out via the positive electrolyte outflow path 15a of the frame member 30 from the cells 20, flows out to the positive electrode return piping 15 of the positive electrolyte return path that is connected to the cell stack 13, and returns to the positive electrolyte tank. On the other hand, the negative electrolyte L− that has flowed out of the negative electrolyte tank 12 flows via the negative electrode outward piping 16 of the negative electrolyte outward path into the respective cells 20 of the cell stack 13. The negative electrolyte L− that has flowed into the cell stack 13 flows through the negative electrolyte inflow path 16a of the frame member 30 into the negative electrode chamber 32a. After this, the negative electrolyte L− that has flowed out from the negative electrode chamber 32a flows out via the negative electrolyte outflow path 17a of the frame member 30 from the cells 20, flows out to the negative electrode return piping 17 of the negative electrolyte return path that is connected to the cell stack 13, and returns to the negative electrolyte tank 12.

Also, with the battery 10 according to the present embodiment, due to the pump operation, part of the positive electrolyte L+ inside the positive electrolyte inflow path 14a flows into the entrance open circuit voltage measuring unit 80 from the flow splitting hole 44 of the first electrolyte frame 40 via the inflow positive electrolyte flow splitting path 18a. Similarly, part of the negative electrolyte L− inside the negative electrolyte inflow path 16a flows into the entrance open circuit voltage measuring unit 80 from the flow splitting hole 57 of the first liquid separation plate 50 via the inflow negative electrolyte flow splitting path 18b. With the cell stack 13 that is equipped with such flow paths, during operation of the redox flow battery 10, the entrance open circuit voltage (upstream open circuit voltage) is measured from time to time at the entrance open circuit voltage measuring unit (the upstream open circuit voltage measuring unit) 80. Also due to the pump operation, part of the positive electrolyte L+ inside the positive electrolyte outflow path 15a flows into the exit open circuit voltage measuring unit 90 from the flow splitting hole 51b of the first liquid separation plate 50 via the outflow positive electrolyte flow splitting path 18c. Similarly, part of the negative electrolyte L− inside the negative electrolyte outflow path 17a flows into the exit open circuit voltage measuring unit 90 from the flow splitting hole 65 of the second electrolyte frame 60 via the outflow negative electrolyte flow splitting path 18d. With the cell stack 13 that is equipped with such flow paths, during operation of the redox flow battery, the exit open circuit voltage (downstream open circuit voltage) is measured from time to time at the exit open circuit voltage measuring unit (the downstream open circuit voltage measuring unit) 90. Based on the entrance open circuit voltage and the exit open circuit voltage, a voltage difference between the two voltages is calculated from time to time. Accordingly, it is possible to know the charging level of the battery, that is, the electrolyte tanks 11 and 12, based on the entrance open circuit voltage, and to also know the change in the charging level (or discharging level) inside the cell stack 13 in real time based on such voltage difference.

Second Embodiment

A redox flow battery according to a second embodiment will now be described with reference to FIGS. 6 and 7. Compared to the battery 10 according to the first embodiment, the redox flow battery according to the present embodiment has characteristics that relate to the arrangement of an entrance open circuit voltage measuring unit 80a and an exit open circuit voltage measuring unit 90a and to the construction of the units 80a and 90a, but otherwise has the same configuration and effect as the battery 10 of the first embodiment. For this reason, the differences in configuration with the battery 10 according to the first embodiment will be described in detail here and configurations that are the same have been assigned the same reference numerals and description thereof is omitted. Note that in FIG. 6, the side surface of the cell stack is depicted and other parts have been omitted.

Figure 6:
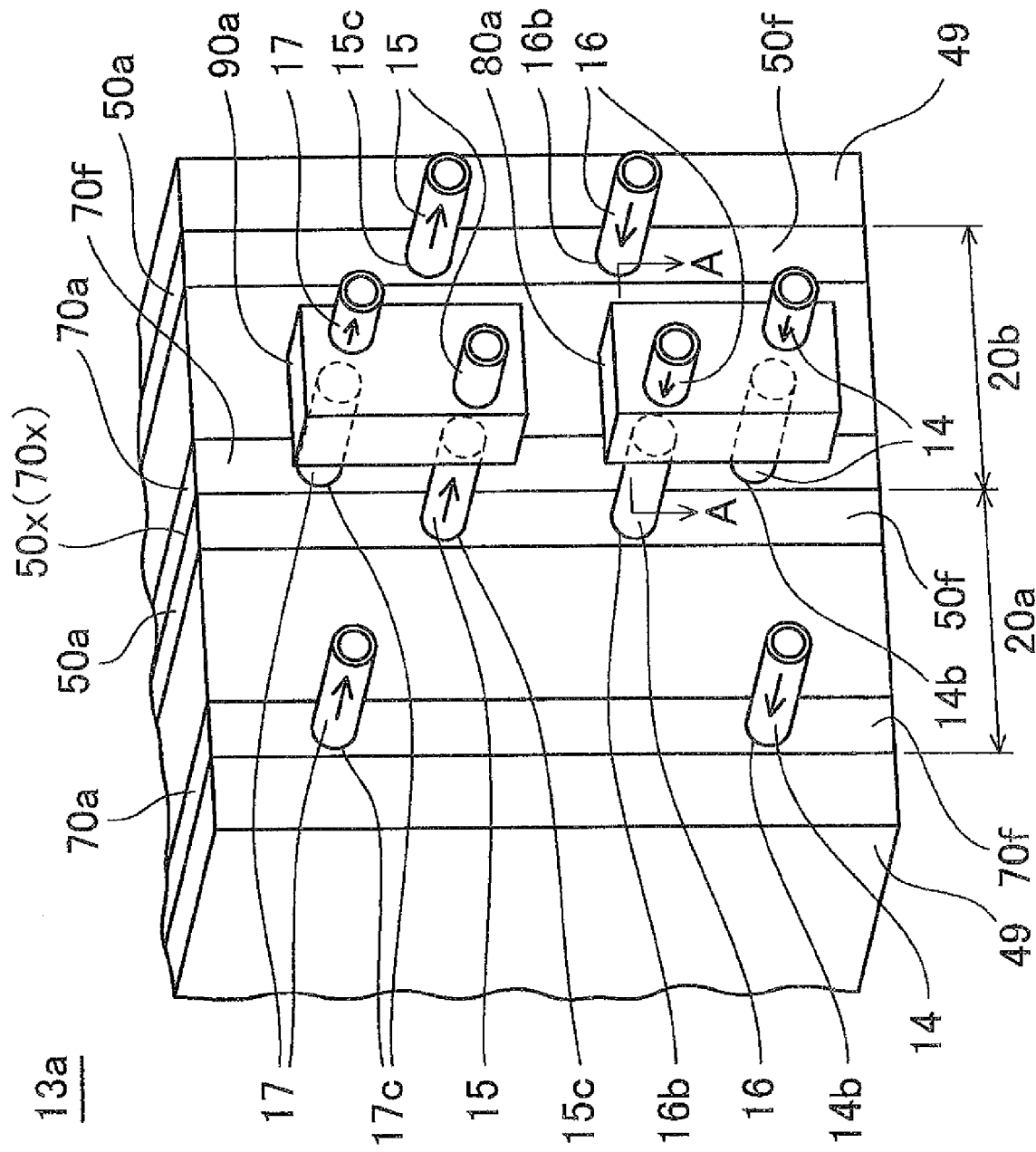
FIG. 6 is a partial perspective view showing a side surface of a cell stack of a redox flow battery according to a second embodiment.

As depicted in FIG. 6, a cell stack 13a of the battery according to the present embodiment is configured in the same way as the first embodiment so that a plurality of sub-stack cells 20a and 20b (two sub-stack cells are depicted in FIG. 6) that have been disposed in a stack are sandwiched by pressing plates 49. In the respective sub-stack cells 20a and 20b, a plurality of unit cells disposed in a stack are sandwiched by a pair of liquid separation plates (a first liquid separation plate 50a and a second liquid separation plate 70a). Note that the stacked construction of the unit cells, bolts and nuts that are sandwiched by the pair of pressing plates 49, and the attachment structure have been omitted from the description and the drawings. In the cell stack 13a configured in this way, the first liquid separation plate ("one liquid separation plate") 50a of the first sub-stack cell 20a that is one out of the plurality of sub-stack cells 20a and 20b and the second liquid separation plate ("another liquid separation plate") 70a of the second sub-stack cell 20b that is adjacent to the first sub-stack cell 20a are disposed adjacent to one another. In more detail, the first liquid separation plate 50a of the first sub-stack cell 20a and the second liquid separation plate 70a of the second sub-stack cell 20b are disposed in a state where rear surfaces 50 and 70x of the liquid separation plates 50a and 70a are in contact. Note that the expression "a state where the first liquid separation plate 50a of the first sub-stack cell 20a is adjacent to the second liquid separation plate 70a of the second sub-stack cell 20b" is for example a state where the first liquid separation plate 50a of the first sub-stack cell 20a is closer to the second liquid separation plate 70a of the second sub-stack cell 20b than the second liquid separation plate 70a of the first sub-stack cell 20a.

An outlet 15c of a positive electrolyte outflow path (not illustrated) inside the first liquid separation plate 50a and an inlet 16b of a negative electrolyte inflow path (not illustrated) inside the first liquid separation plate 50 are formed on one side end surface 50f of the first liquid separation plate 50a of the sub-stack cells 20a and 20b, and an inlet 14b of a positive electrolyte inflow path (not illustrated) inside the second liquid separation plate 70a and an outlet 17c of a negative electrolyte outflow path (not illustrated) inside the second liquid separation plate 70a are formed on one side end surface 70f of the second liquid separation plate 70a. That is, the inlets 14b and 16b and the outlets 15c and 17c are formed on the pair of liquid separation plates 50a and 70a. The positive electrode outward piping 14 is connected to the inflow 14b of the positive electrolyte inflow path, the positive electrode return piping 15 is connected to the outflow 15c of the positive electrolyte outflow path, the negative electrode outward piping 16 is connected to the inlet 16b of the negative electrolyte inflow path, and the negative electrode return piping 17 is connected to the outlet 17c of the negative electrolyte outflow path. Note that the arrows indicated on the pipes depicted in FIGS. 6 and 7 show the directions in which electrolyte (the positive electrolyte L+ or the negative electrolyte L−) flows.

The open circuit voltage measuring units 80*a* and 90*a* are disposed on the electrolyte flow paths between the inlets 14*b* and 16*b* or the outlets 15*c* and 17*c* and the positive electrolyte tank 11 or the negative electrolyte tank 12 (see FIG. 1). In more detail, the open circuit voltage measuring units 80*a* and 90*a* are disposed at intermediate positions of (i.e., on the flow paths of) the piping 14, 15, 16 and 17 that connect the inlets 14*b* and 16*b* or the outlets 15*c* and 17*c* and the positive electrolyte tank 11 or the negative electrolyte tank 12 (see FIG. 6). Accordingly, the positive electrolyte L+ that has been sent out from the positive electrolyte tank 11 to the positive electrode outward piping 14 is sent through the entrance open circuit voltage measuring unit 80*a* (a positive electrolyte circulation chamber 84, described later, see FIG. 7) to the positive electrolyte inflow paths inside the sub-stack cells 20*a* and 20*b*. The positive electrolyte L+ sent out from the positive electrode chamber to the positive electrolyte outflow paths inside the sub-stack cells 20*a* and 20*b* is then sent through the exit open circuit voltage measuring unit 90*a* (a positive electrolyte circulation chamber 94, described later, see FIG. 7) to the positive electrolyte tank 11. Similarly, the negative electrolyte L− that has been sent out from the negative electrolyte tank 12 to the negative electrode outward piping 16 is sent through the entrance open circuit voltage measuring unit 80*a* (a negative electrolyte circulation chamber 85, described later) to the negative electrolyte inflow paths inside the sub-stack cells 20*a* and 20*b*. The negative electrolyte L− sent out from the negative electrode chamber to the negative electrolyte outflow paths inside the sub-stack cells 20*a* and 20*b* is then sent through the exit open circuit voltage measuring unit 90*a* (a negative electrolyte circulation chamber 95, described later) to the negative electrolyte tank 12.

In the entrance open circuit voltage measuring unit 80*a*, the upstream open circuit voltage is measured between the positive electrolyte L+ inside the positive electrode outward piping 14 (the positive electrolyte outward path) of the second sub-stack cell 20*b* (i.e., one of the cells) and the negative electrolyte L− inside the negative electrode outward piping 16 (the negative electrolyte outward path) of the first sub-stack cell 20*a* (i.e., the other of the cells). In the exit open circuit voltage measuring unit 90*a*, the downstream open circuit voltage is measured between the positive electrolyte L+ inside the positive electrode return piping 15 (the positive electrolyte return path) of the first sub-stack cell 20*a* (i.e., one of the cells) and the negative electrolyte L− inside the negative electrode return piping 17 (the negative electrolyte return path) of the second sub-stack cell 20*b* (i.e., the other of the cells).

Figure 7:
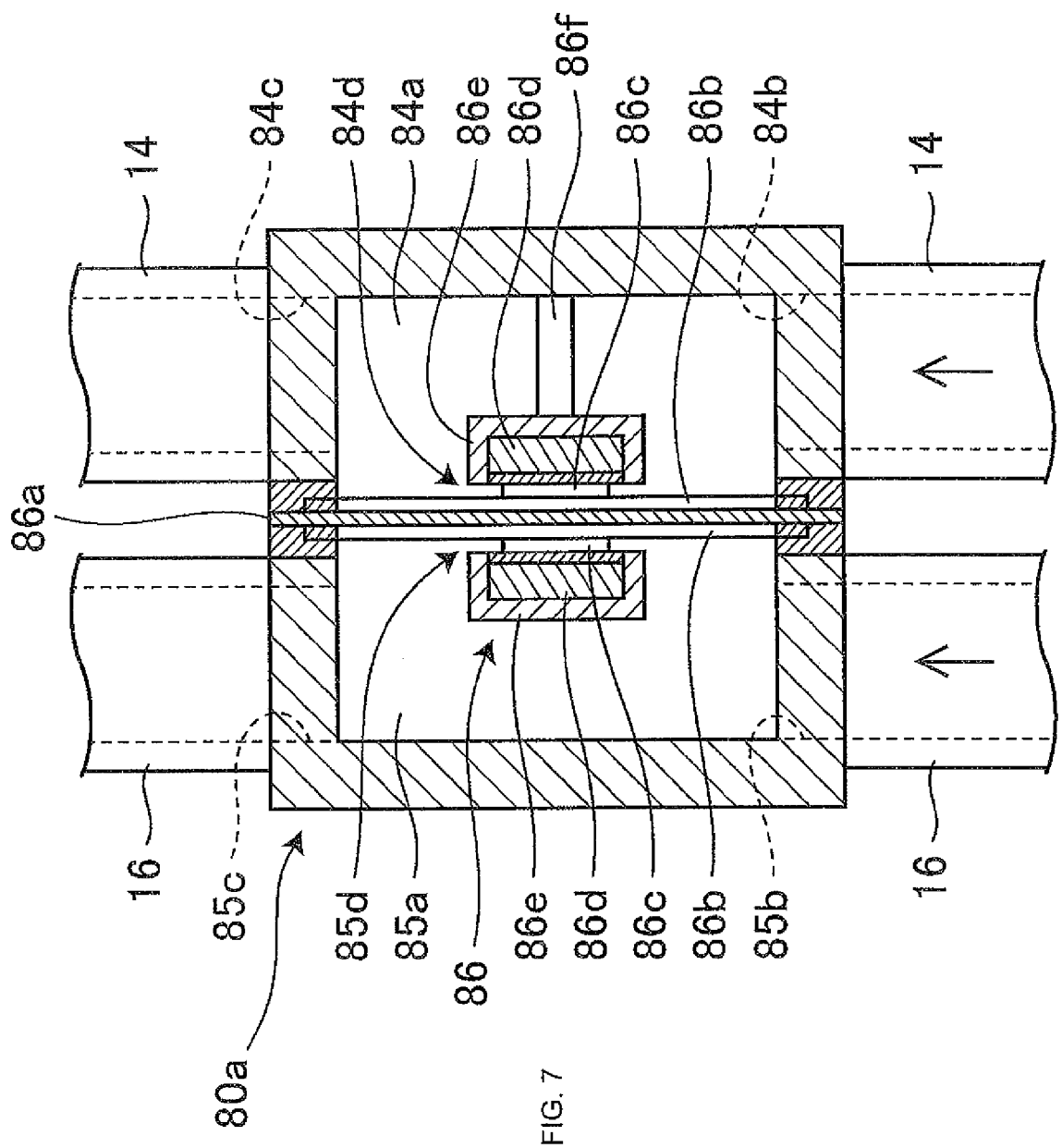
FIG. 7 is a cross-sectional view on a plane A-A that depicts the construction of an entrance open circuit voltage measuring unit depicted in FIG. 6.

The entrance open circuit voltage measuring unit 80*a* internally houses a measuring cell portion 86 (upstream open circuit voltage measuring unit), described later, and as depicted in FIG. 7, includes the integrally formed positive electrolyte circulation chamber 84 and negative electrolyte circulation chamber 85, connecting holes 84*x* that connect the circulation chambers 84 and 85, a positive electrolyte inlet 84*a* and a positive electrolyte outlet 84*b* that are connected to the positive electrolyte circulation chamber 84, and a negative electrolyte inlet 85*a* and a negative electrolyte outlet 85*b* that are connected to the negative electrolyte circulation chamber 85. Such entrance open circuit voltage measuring unit 80*a* in which the above elements are integrally formed has superior handling with regard to attachment, removal, and the like. The separation distance between the positive electrolyte outlet 84*b* connected to the inlet 14*b* of the positive electrolyte inflow path and the negative electrolyte outlet 85*b* connected to the inlet 16*b* of the negative electrolyte inflow path is the same as the separation distance between the inlet 14*b* of the positive electrolyte inflow path and the inlet 16*b* of the negative electrolyte inflow path. With this configuration, it is possible to connect the positive electrolyte outlet 84*b* and the negative electrolyte outlet 85*b* simultaneously to the inlet 14*b* and the inlet 16*b*, which makes the attachment operation very user friendly.

The measuring cell portion 86 has fundamentally the same configuration as the miniaturized cells 81 and 91 in the first embodiment. That is, the measuring cell portion 86 is equipped with a separator membrane 86*a* disposed at a position of the connecting holes 84*x*, a pair of frame members 86*a* and 86*b* that sandwich the separator membrane, a pair of reaction electrodes (carbon electrodes) 86*c* and 86*c* disposed so as to contact the separator membrane at an opening of the frame members 86*b* and 86*b*, a pair of electrodes 86*d* and 86*d* disposed so as to contact the reaction electrodes 86*c* and 86*c*, and electrode holding portions 86*e* and 86*e* that hold the electrodes 86*d* and 86*d* and protect the electrodes from the electrolyte (the positive electrolyte L+ or the negative electrolyte L−) inside the positive electrolyte circulation chamber 84 and the negative electrolyte circulation chamber 85. Note that the reference numeral "86*f*" is a dam portion that protrudes upward from the base surface of the positive electrolyte circulation chamber 84. When the dam portion 86*f* is provided, it is possible to set the liquid surface height of the positive electrolyte L+ in the positive electrolyte circulation chamber 84 at a high position, so that it is possible for the positive electrolyte L+ to reliably contact the reaction electrode 86*c* inside the positive electrolyte circulation chamber 84. By doing so, it is possible to measure the entrance open circuit voltage more reliably. The reference numerals "84*d*" and "85*d*" are slit opening portions (gap portions) between the frame members 86*b* and the electrode holding portions 86*e*. When the slit opening portions 84*d* and 85*d* are provided, it is possible for the electrolyte inside the positive electrolyte circulation chamber 84 and inside the negative electrolyte circulation chamber 85 to reliably contact the reaction electrodes 86*c* and 86*c*. In the present embodiment, a carbon felt material is used as the reaction electrodes 86*c*. Note that the wiring that connects the electrodes and the wiring paths are omitted from the description and the drawings. Although the open circuit voltage measuring units 80*a* and 90*a* also use seal members or the like as appropriate to prevent electrolyte from leaking, such seal members are omitted from the description and the drawings. The attachment of a gasket and application of a sealant can be given as examples of seal members. With this entrance open circuit voltage measuring unit 80*a*, when the redox flow battery is operating, electrolyte flows into the positive electrolyte circulation chamber 84 and the negative electrolyte circulation chamber 85 of the measuring cell portion 86 and by measuring the voltage across the pair of electrodes 86*d* and 86*d*, it is possible to measure the entrance open circuit voltage.

Note that compared to the entrance open circuit voltage measuring unit 80*a*, the exit open circuit voltage measuring unit 90*a* differs in only the connected positions of the piping and the construction itself is the same, and for that reason, detailed description thereof is omitted here.

In a redox flow battery, it is preferable for the pumps for circulating electrolyte to have low power consumption, and to achieve this, it is preferable for the total length of the electrolyte path to be short. However, to measure the entrance open circuit voltage and the exit open circuit voltage described above, piping on which electrolyte flows toward the voltage measuring units is necessary, resulting in a tendency for the total length of the flow paths of electrolyte to increase. In particular, when the open circuit voltage measuring unit is retrofitted to a redox flow battery, there is a tendency for the total length of the flow paths of electrolyte to increase, such as due to additional piping becoming necessary. With the redox flow battery according to the present embodiment and the open circuit voltage measuring units 80a and 90a used in such battery, since it is easy to install the open circuit voltage measuring units 80a and 90a at intermediate positions on the paths of the piping 14, 15, 16, and 17 disposed in advance, an increase in the total length of the flow paths of electrolyte is reliably avoided. By doing so, if it is possible to reduce the power consumption of the pump, it is possible to increase the amount of power that can be discharged from the redox flow battery.

In the battery according to the embodiment described above, the inlets 14b and 16b and the outlets 15c and 17c are disposed so that a straight line that joins the inlet 14b of the positive electrolyte inflow path and the inlet 16b of the negative electrolyte inflow path does not intersect a straight line that joins the outlet 15c of the positive electrolyte outflow path and the outlet 17c of the negative electrolyte outflow path. In more detail, the inlets 14b and 16b and the outlets 15c and 17c are disposed so that in a state where the side end surfaces 50f and 70f of the liquid separation plates 50a and 70a where the inlets 14b and 16b and the outlets 15c and 17c are formed are viewed from the front (in a state where the viewing direction is perpendicular to the side end surfaces), the two straight lines do not intersect. When this layout is used, since it is possible to dispose the measuring units 80a and 90a close to one another in a compact state, such as with the open circuit voltage measuring units 80a and 90a close to one another in the up-down direction as in the battery according to the present embodiment for example, it is possible to miniaturize the battery and also to make the battery easy to maintain.

Third Embodiment

Figure 9:
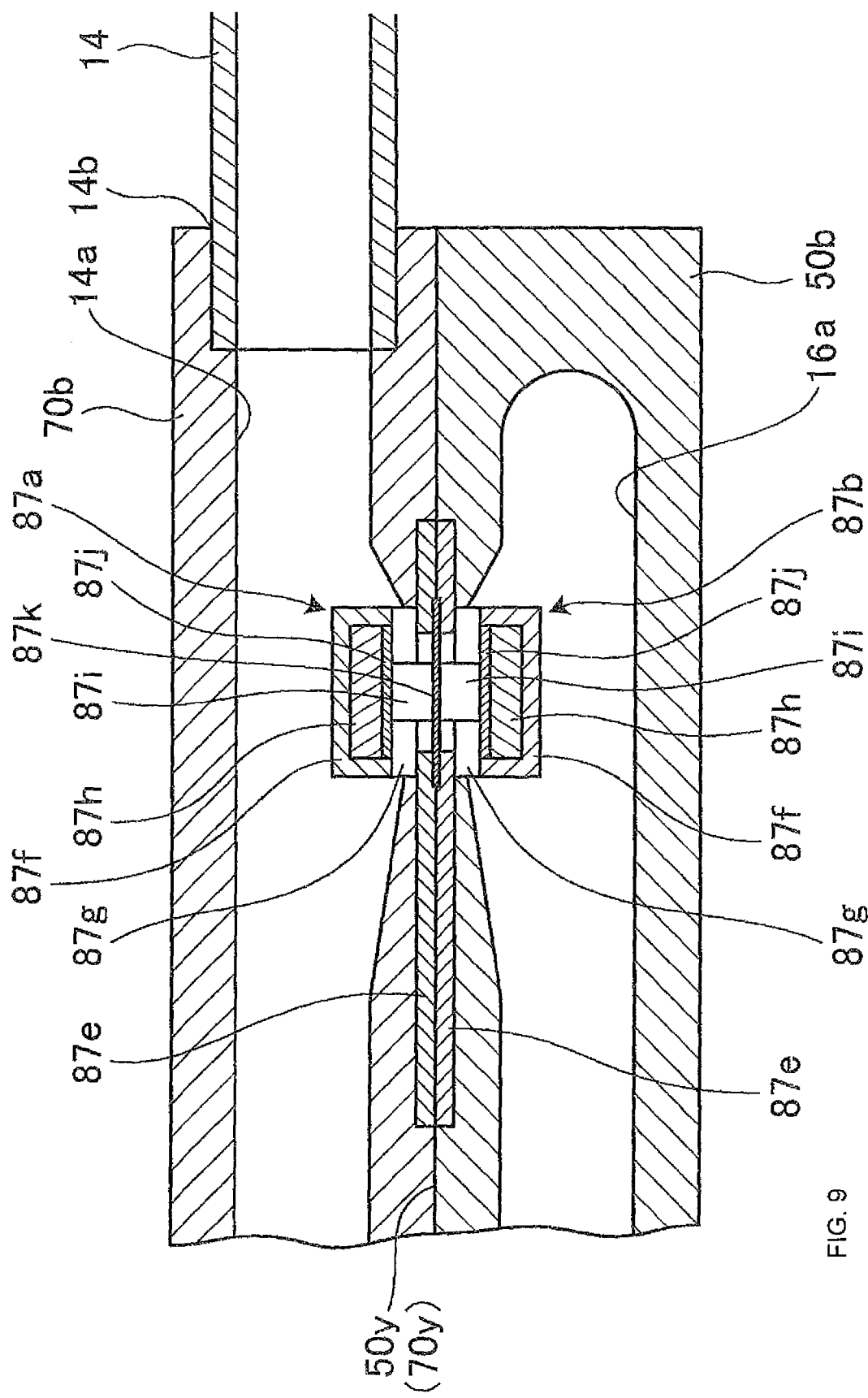
FIG. 9 is a partial cross-sectional view on a plane B-B that depicts the construction of a cell stack depicted in FIG. 8.
Figure 10:
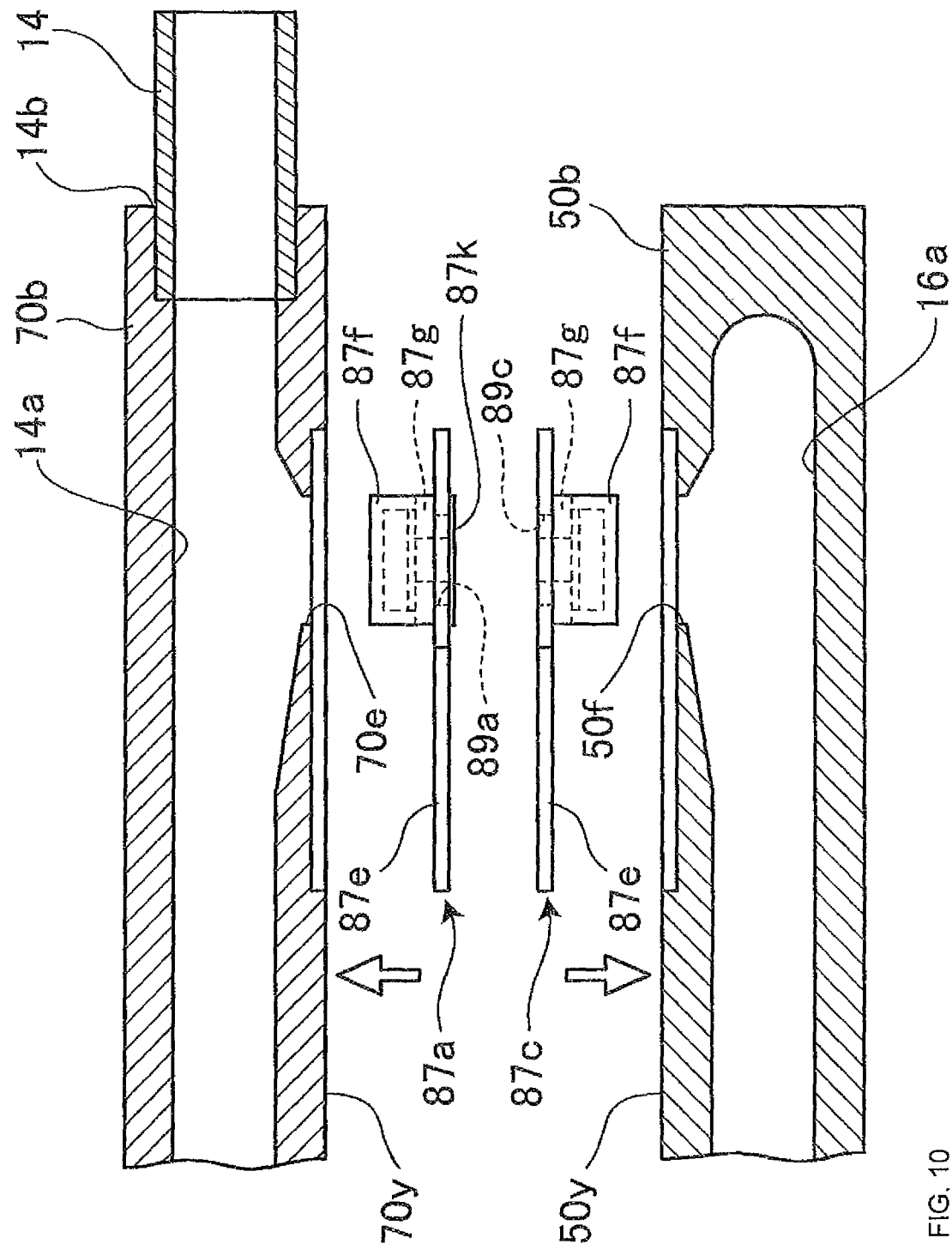
FIG. 10 is a partial exploded cross-sectional view that depicts the construction of the cell stack depicted in FIG. 9.

Next, a redox flow battery according to a third embodiment will be described with reference to FIGS. 8 to 12. Compared to the battery according to the second embodiment, the redox flow battery according to the present embodiment has a characteristic relating to the configuration of the cell stack of the battery. For this reason, the configuration that is different to the cell stack 13a (see FIG. 6) of the battery according to the second embodiment will be described in detail here. Configurations that are the same as the cell stack 13a of the battery according to the second embodiment have been assigned the same reference numerals and description of the same configuration and effects is omitted. Note that in FIG. 8, the side surface of the cell stack is depicted and other parts have been omitted. Parts of the liquid separation plates 50b and 70b whose rear surfaces are in contact are depicted in FIGS. 9 and 10 and parts aside from the liquid separation plates are omitted. Parts of the rear surfaces 50y and 70y of the liquid separation plates 50b and 70b, whose rear surfaces are in contact, where the connecting holes 50e, 50f, 70e, and 70f are formed are depicted in FIG. 11 and other parts are omitted.

Figure 8:
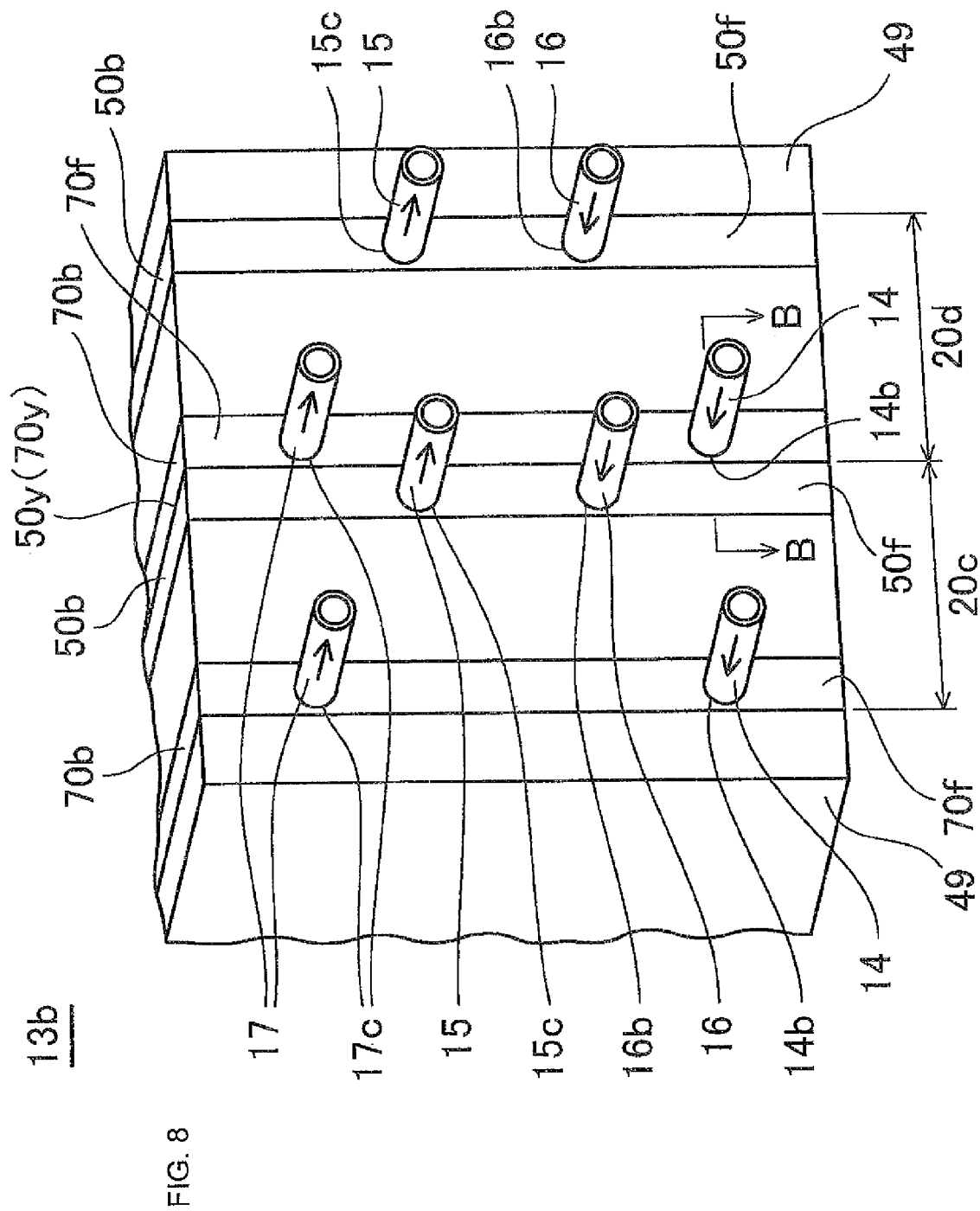
FIG. 8 is a partial perspective view showing a side surface of a cell stack of a redox flow battery according to a third embodiment.

As depicted in FIG. 8, in the same way as the cell stack 13a according to the second embodiment, the cell stack 13b of the battery according to the present embodiment includes a plurality of sub-stack cells 20c and 20d disposed in a stack (two sub-stack cells are depicted in FIG. 8), and the sub-stack cells 20c and 20d are respectively equipped with a pair of liquid separation plates (the first liquid separation plate 50b and the second liquid separation plate 70b). The first liquid separation plate 50b of the first sub-stack cell 20c and the second liquid separation plate 70b of the second sub-stack cell 20d are disposed in a state where the rear surfaces 50y and 70y of both liquid separation plates 50b and 70b are in contact. The outlet 15c and the inlet 16b are formed on one side end surface 50f of the first liquid separation plate 50b of the sub-stack cells 20c and 20d and the inlet 14b and the outlet 17c are formed on one side end surface 70f of the second liquid separation plate 70b. In addition, the positive electrode outward piping 14 is connected to the inlet 14b, the positive electrode return piping 15 is connected to the outlet 15c, the negative electrode outward piping 16 is connected to the inlet 16b, and the negative electrode return piping 17 is connected to the outlet 17c. Note that the arrows indicated on the pipes depicted in FIG. 8 show the directions in which electrolyte (the positive electrolyte L+ or the negative electrolyte L−) flows.

Figure 12:
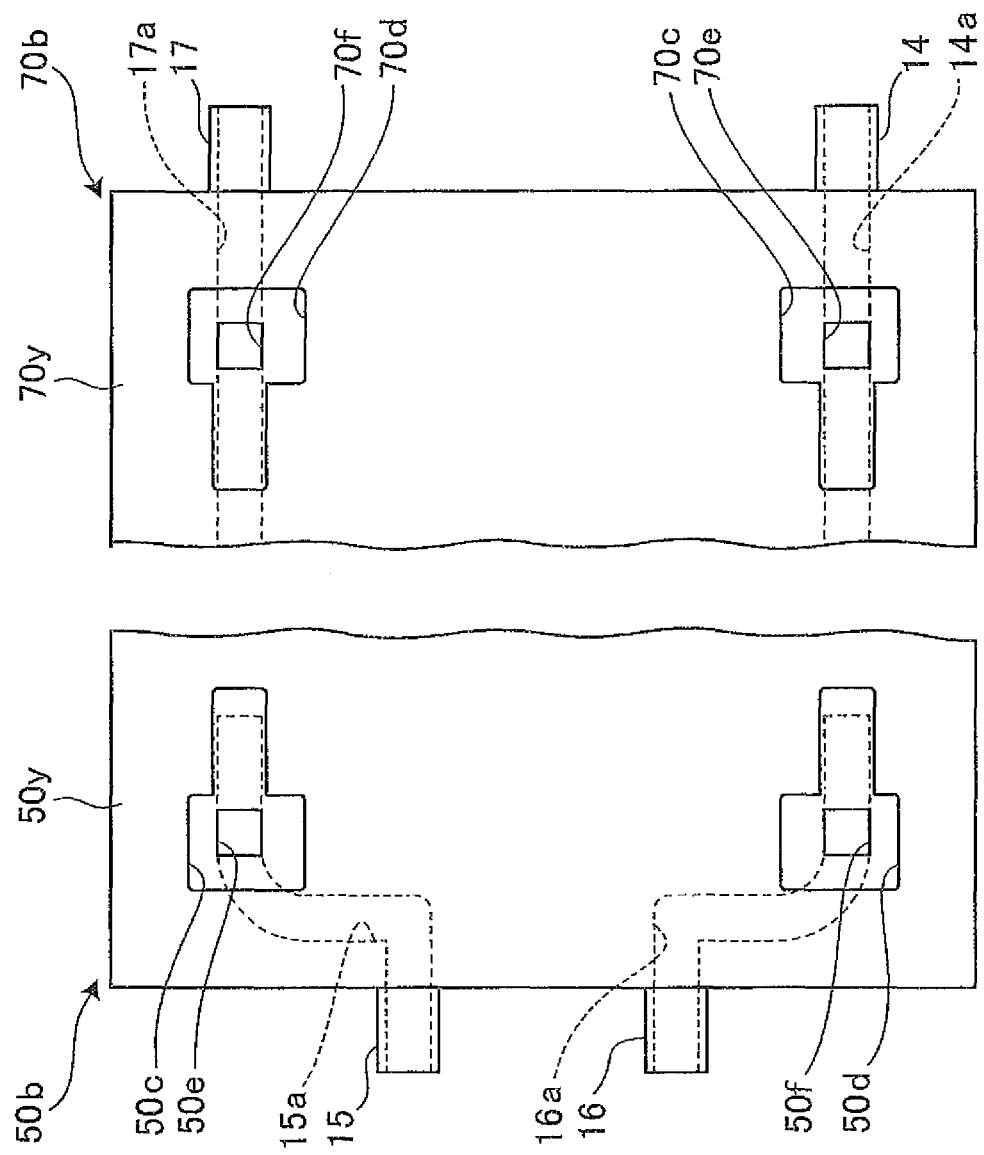
FIG. 12 is a partial side view that depicts a state where the attachment members have been removed from the liquid separation plates depicted in FIG. 10.

As depicted in FIG. 12, a second concave portion 50c to which a second attachment member 87b, described later is attached and a third concave portion 50d to which a third attachment member 87c is attached are formed in the rear surface 50y of the first liquid separation plate 50b. A second connecting hole 50e that is connected to the positive electrolyte outflow path 15a is formed inside the second concave portion 50c and a third connecting hole 50f that is connected to the negative electrolyte outflow path 15a is formed inside the second concave portion 50c. In the same way, a first concave portion 70c to which a first attachment member 87a, described later is attached and a fourth concave portion 70d to which a fourth attachment member 87d is attached are formed in the rear surface 70y of the second liquid separation plate 70b. A first connecting hole 70e that is connected to the positive electrolyte inflow path 14a is formed inside the first concave portion 70c and a fourth connecting hole 70f that is connected to the negative electrolyte outflow path 17a is formed inside the fourth concave portion 70d. That is, the connecting holes 50e, 50f, 70e, and 70f are formed at positions on any of the two rear surfaces 50y and 70y. The first connecting hole 70e and the third connecting hole 50f are disposed opposite one another on different rear surfaces and the second connecting hole 50e and the fourth connecting hole 70f are disposed opposite one another on different rear surfaces.

Figure 11:
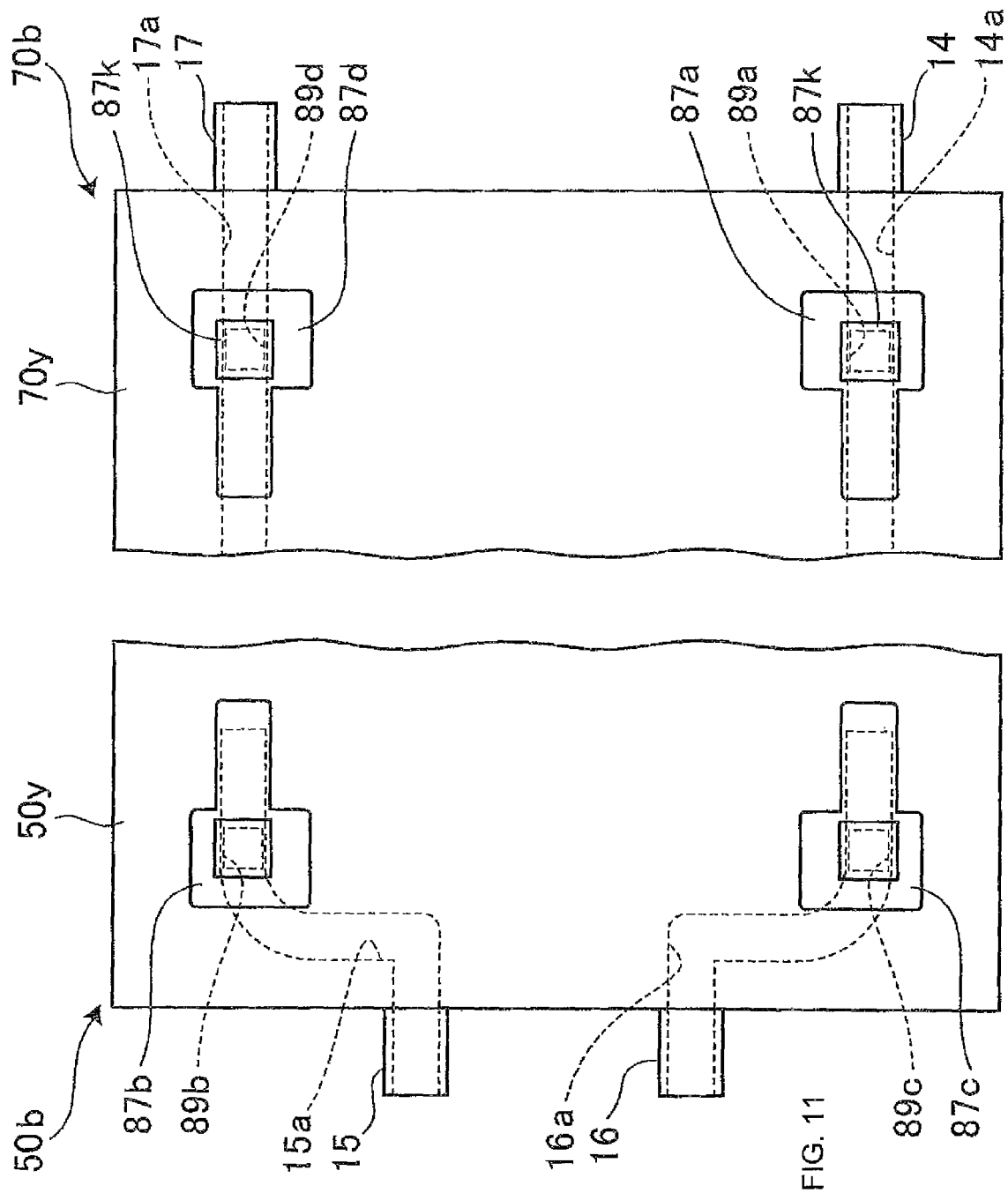
FIG. 11 is a partial side view that depicts rear surfaces of the liquid separation plates that construct the cell stack depicted in FIG. 8 when looking in the directions depicted by the arrow in FIG. 10.

The cell stack 13b includes the first attachment member 87a that is attached to the first connecting hole 70e, the second attachment member 87b that is attached to the second connecting hole 50e, the third attachment member 87c that is attached to the third connecting hole 50f, and the fourth attachment member 87d that is attached to the fourth connecting hole 70f (see FIG. 11). Note that it is possible to detachably attach the respective attachment members to the connecting holes. As depicted in FIG. 10, the first attachment member 87a includes a plate-like main body 87e and a hollow protruding portion 87f that becomes positioned inside the positive electrolyte inflow path 14a when the first attachment member 87a is attached. A slit hole 87g that passes through in the width direction (the direction in which the positive electrolyte inflow path 14a extends) is formed at a base position of the protruding portion 87f (a position adjacent to the main body 87e) and a first through-hole 89a that passes from the slit hole 87f through to the other side is formed in the main body 87e (see FIG. 11). That is, the through-hole 89a connects the slit hole 87g and the hollow portion of the protruding portion 87f. As depicted in FIG. 9, the protruding portion 87f is equipped with an electrode 87h attached to the hollow portion, a reaction electrode (carbon electrode) 87i disposed in a state contacting the electrode 87$h$, a holding portion 87$j$ that holds the reaction electrode 87$i$ and protects the electrode 87$h$ from the positive electrolyte L+ inside the positive electrolyte inflow path 14$a$, and a separator membrane 87$k$ attached so as to contact the reaction electrode 87$i$ at the position of the first through-hole 89$a$. When the positive electrolyte L+ is caused to circulate to the positive electrolyte inflow path 14$a$ in this state where the first attachment member 87$a$ has been attached to the first connecting hole 70$e$, part of the positive electrolyte L+ passes through the slit hole 87$g$ and contacts the reaction electrode 87$i$. By doing so, it is possible to measure the open circuit voltage.

Note that since the configurations of the second attachment member 87$b$, the third attachment member 87$c$, and the fourth attachment member 87$d$ are the same as the configuration of the first attachment member 87$a$, the same reference numerals have been assigned to the same configurations (aside from the through-holes) and detailed description thereof is omitted. Note that the reference numeral "89$b$" is assigned to the through-hole (second through-hole) of the second attachment member 87$b$, the reference numeral "89$c$" is assigned to the through-hole (third through-hole) of the second attachment member 87$c$, and the reference numeral "89$d$" is assigned to the through-hole (fourth through-hole) of the fourth attachment member 87$d$ (see FIG. 11). Also, although the liquid separation plates 50$b$ and 70$b$ use seal members as appropriate to prevent electrolyte from leaking, such seal members are omitted from the description and the drawings.

The through-holes 89$a$ to 89$d$ are arranged as follows. That is, the first through-hole 89$a$ of the first attachment member 87$a$ attached to the first connecting hole 70$e$ and the third through-hole 89$c$ of the third attachment member 87$c$ attached to the third connecting hole 50$f$ are disposed opposite one another (see FIG. 11). In the same way, the second through-hole 89$b$ of the second attachment member 87$b$ attached to the second connecting hole 50$e$ and the fourth through-hole 89$d$ of the fourth attachment member 87$d$ attached to the fourth connecting hole 70$f$ are disposed opposite one another.

Accordingly, when the cell stack 13$b$ is assembled in a state where the attachment members 87$a$ to 87$d$ have been attached to the corresponding connecting holes, the rear surface 50$y$ of the first liquid separation plate 50$b$ of the first sub-stack cell 20$c$ and the rear surface 70$y$ of the second liquid separation plate 70$b$ of the second sub-stack cell 20$d$ contact one another, producing a state where the first through-hole 89$a$ of the first attachment member 87$a$ and the third through-hole 89$c$ of the third attachment member 87$c$ become opposite one another (see FIG. 9). In the same way, the second through-hole 89$b$ of the second attachment member 87$b$ and the fourth through-hole 89$d$ of the fourth attachment member 87$d$ become opposite one another (not illustrated). When assembled in this state, as depicted in FIG. 9, the separator membrane 87$k$ becomes sandwiched between the reaction electrode 87$i$ of the first attachment member 87$a$ and the reaction electrode 87$i$ of the third attachment member 87$c$, thereby constructing the entrance open circuit voltage measuring unit. In the same way, the exit open circuit voltage measuring unit is constructed by the second attachment member 87$b$ and the fourth attachment member 87$d$. Note that the separator membrane 87$k$ sandwiched by the reaction electrode 87$i$ of the first attachment member 87$a$ and the reaction electrode 87$i$ of the third attachment member 87$c$ may be a single membrane. Accordingly, when attachment members to which the separator members 87$k$ have been attached in advance are used as the first attachment member 87$a$ and the third attachment member 87$c$, it is possible to use an attachment member from which the separator member has been removed as one of the attachment members. On the other hand, when attachment members to which separator membranes 87$k$ have not been attached are used, the attachment members are used in assembly after a separator membrane 87$k$ has been stuck onto one of the attachment members. In the present embodiment, seal members that prevent electrolyte from leaking from the periphery of the separator membrane 87$k$ are omitted from the description and the drawings.

In this way, with the battery according to the present embodiment, the entrance open circuit voltage measuring unit is constructed of the first attachment member 87$a$ and the third attachment member 87$c$ and the exit open circuit voltage measuring unit is constructed of the second attachment member 87$b$ and the fourth attachment member 87$d$. With this configuration, assembly is facilitated since the open circuit voltage measuring units are assembled at the same time as the cell stack 13$b$ is assembled.

Figure 13:
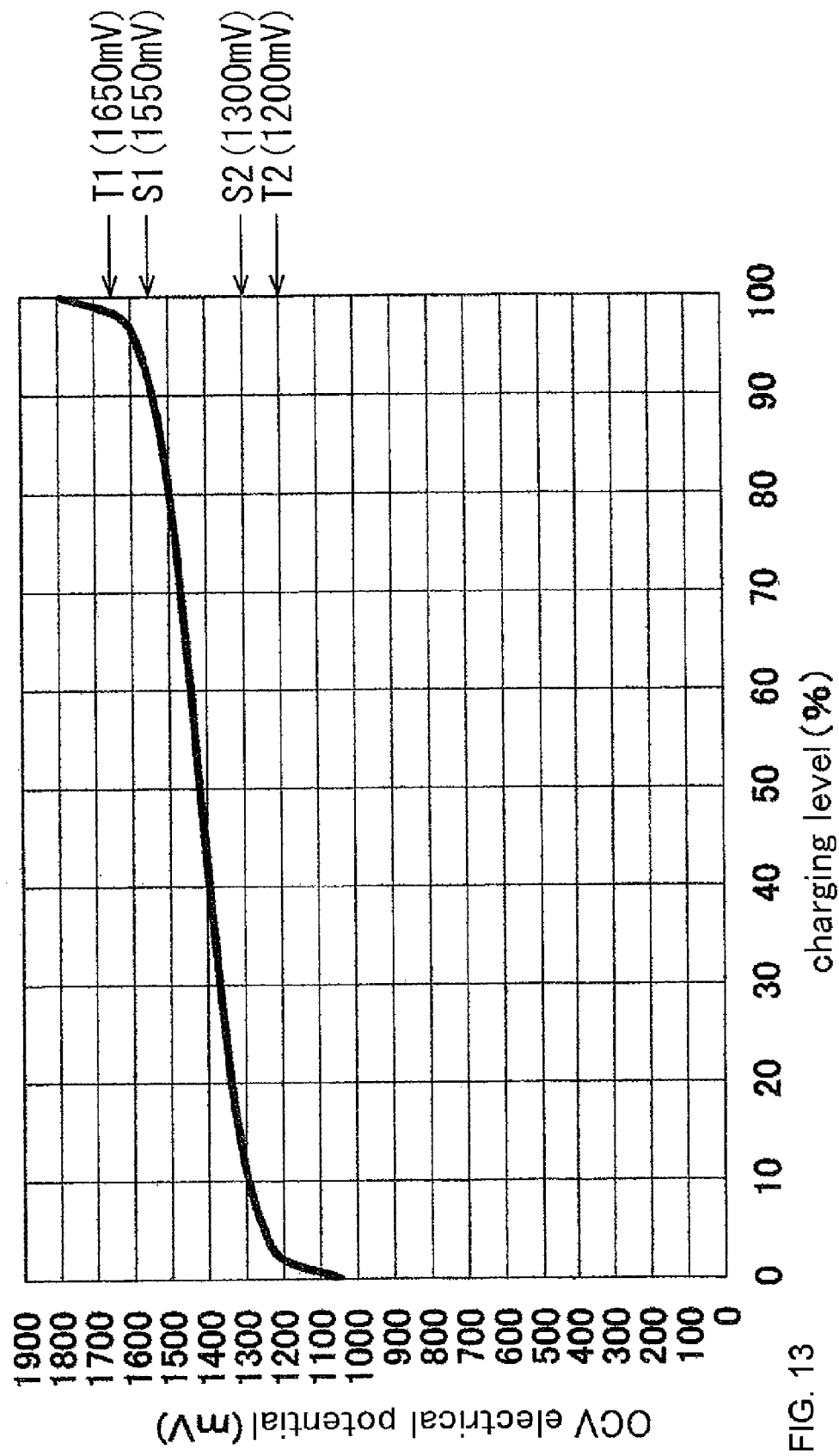
FIG. 13 is a graph depicting the relationship between the state of charge (charging/discharging level) of the electrolyte and the open circuit voltage (OCV).

For a vanadium electrolyte, the relationship between the state of charge (SOC, hereinafter referred to as the "charging/discharging level") of the electrolyte and the open circuit voltage is the relationship depicted in the graph in FIG. 13. In simple terms, the state of charge referred to here is the ratio of pentavalent vanadium ions to the total number of vanadium ions in the positive electrolyte (and negative electrolyte) being measured (for the negative electrolyte, the ratio of divalent vanadium ions to the total number of vanadium ions). As shown in the drawings, the slope (rate of change) of the open circuit voltage to the charging/discharging level is always positive, and as charging progresses and the charging level increases (as the state of charge approaches 100%), the open circuit voltage value increases, and conversely, as discharging progresses and the charging level decreases (as the discharging level increases), the open circuit voltage value decreases. Also, in a range where the charging level is close to 100% and a range where the charging level is close to 0% (where the discharging level is 0%), the absolute value of the slope (rate of change) of the open circuit voltage to the charging level increases.

Accordingly, with the redox flow battery 10 according to the first embodiment for example, when there is a sudden increase in generated power during a charging operation, the charging level of the electrolyte (the positive electrolyte and the negative electrolyte) inside the positive electrode chamber 31$a$ and the negative electrode chamber 32$a$ of the cell stack 13 suddenly rises. Electrolyte whose charging level has suddenly risen flows out from the positive electrode chamber 31$a$ and the negative electrode chamber 32$a$ and part of such electrolyte flows immediately into the exit open circuit voltage measuring unit 90 installed inside the cell stack 13. When this happens, the exit open circuit voltage detected by the miniaturized cell 91 inside the unit 90 will suddenly rise. In this way, with the redox flow battery 10 according to the first embodiment, it is possible to quickly detect the charging level of the electrolyte inside the positive electrode chamber 31$a$ and the negative electrode chamber 32$a$ of the cell stack 13.

Note that the electrolyte whose charging level has suddenly risen is then returned to the positive electrolyte tank 11 and the negative electrolyte tank 12, is mixed with the electrolyte inside the respective tanks 11 and 12 and is sent once again toward the cell stack 13. When part of the electrolyte that is sent out flows into the entrance open circuit voltage measuring unit 80 installed inside the cell stack 13, a change will occur in the rate of change of the entrance open circuit voltage detected by the unit 80 (the rate of change of the charging level will increase). In this way, by merely measuring the entrance open circuit voltage, it is difficult to quickly detect a sudden change in the charging level of the electrolyte inside the cell stack 13 and even if detection is possible, some time will be taken. If detection takes time, there is the risk that the electrolyte will reach an overcharged state before detection is performed. If the electrolyte reaches an overcharged state, there is the risk of problems such as precipitation of material dissolved in the electrolyte.

With the battery 10 according to the first embodiment, it is possible to know the charging level of the battery based on the entrance open circuit voltage, and also possible to know the change in the charging level (or discharging level) inside the cell stack 13 in real time based on the voltage difference between the entrance open circuit voltage and the exit open circuit voltage. Accordingly, as described earlier, even if the charging level of the electrolyte inside the cell stack 13 has suddenly changed, it is possible to quickly and reliably detect such change. In addition, since the battery 10 according to the first embodiment is equipped with the entrance open circuit voltage measuring unit 80 and the exit open circuit voltage measuring unit 90 inside the cell stack 13, it is possible to measure the entrance open circuit voltage using the electrolyte immediately before the electrolyte enters the positive electrode chamber 31a and the negative electrode chamber 32a and to measure the exit open circuit voltage using the electrolyte immediately after the electrolyte has exited the positive electrode chamber 31a and the negative electrode chamber 32a. Accordingly, it is possible to detect changes in the charging level inside the cell stack 13 extremely quickly. In addition to the measuring units 80 and 90, the inflow positive electrolyte flow splitting path 18a, the inflow negative electrolyte flow splitting path 18b, the outflow positive electrolyte flow splitting path 18c, and the outflow negative electrolyte flow splitting path 18d are provided inside the cell stack 13. That is, the flow splitting paths are configured using short flow paths. When the flow paths are short, it is possible to manage and control the flow of electrolyte from the entrances of the flow splitting paths to the measuring units more accurately. For example, consider the time taken for the electrolyte to reach the measuring units from the entrances of the flow splitting paths. It becomes easier to cause the positive electrolyte L+ and the negative electrolyte L− that have flowed out of the positive electrode chamber 31a and the negative electrode chamber 32a at the same time to flow with a shorter time lag into the measuring unit 90.

As one example, with the battery 10 in the first embodiment, when, during charging, the exit open circuit voltage reaches an upper limit set value S1 (for example, 1550 mV, see FIG. 13) of a stable voltage range, it is possible to carry out control to increase the flow rate of the electrolyte. When the charging level of the electrolyte inside the positive electrode chamber 31a and the negative electrode chamber 32a has started to change suddenly, if it were only possible to measure the entry open circuit voltage, it would not be possible to respond to the sudden change and there would be the risk of a problem where the electrolyte reaches an overcharged state. If the exit open circuit voltage is measured as in the first embodiment, it is possible to quickly detect the sudden rise in the charging level of the electrolyte and to increase the flow rate of electrolyte when the exit open circuit voltage has reached the upper limit set value S1. By doing so, it is possible to continue charging while suppressing the sudden change in the charging level of the electrolyte and possible to prevent the electrolyte from reaching the overcharged state. By carrying out control so that the exit open circuit voltage does not exceed the upper limit set value S1 (so that the charging/discharging level does not reach 90% or above for example), the operation of the redox flow battery is kept stable and deterioration of the members is avoided.

With the battery 10 according to the first embodiment, when the exit open circuit voltage reaches an upper limit set value T1 of a controlled voltage range (for example, 1650 mV, see FIG. 13), it is possible to carry out control to switch off the circuit switch and stop the charging. By carrying out such control, even if the charging level of the electrolyte that has flowed out of the positive electrode chamber 31a and the negative electrode chamber 32a has suddenly risen, by stopping the charging when the exit open circuit voltage has reached the upper limit set value T1, it is possible to prevent the electrolyte from reaching the overcharged state.

On the other hand, during a discharging operation, if the exit open circuit voltage reaches a lower limit set value S2 (for example, 1300 mV, see FIG. 13), it is possible to carry out control to increase the flow rate of electrolyte. When the charging level of the electrolyte inside the positive electrode chamber 31a and the negative electrode chamber 32a has started to decrease suddenly, if it were only possible to measure the entry open circuit voltage, it would not be able to respond to the sudden change and the electrolyte would reach an over-discharged state where there is the risk of a problem whereby it is no longer possible to supply sufficient power. If the exit open circuit voltage is measured as in the first embodiment, it is possible to quickly detect the sudden fall in the charging level of the electrolyte and possible to increase the flow rate of electrolyte when the exit open circuit voltage has reached the lower limit set value S2. By doing so, it is possible to continue the supplying of power while suppressing any sudden drops in the charging level of the electrolyte, so that the voltage remains stable. When the exit open circuit voltage then reaches a lower limit set value T2 of a controlled voltage range (for example, 1200 mV), the switch is turned off to stop the discharging. By doing so, the electrolyte is prevented from reaching an over-discharged state.

In addition, with the battery 10 according to the first embodiment, it is possible to carry out control as described below using the voltage difference between the entrance open circuit voltage and the exit open circuit voltage. Note that the voltage difference referred to here is a value calculated by subtracting the entrance open circuit voltage from the exit open circuit voltage. The value of the voltage difference calculated during discharging is a negative value. For this reason, the absolute value of the calculated negative value is used as the voltage difference during discharging.

Figure 14:
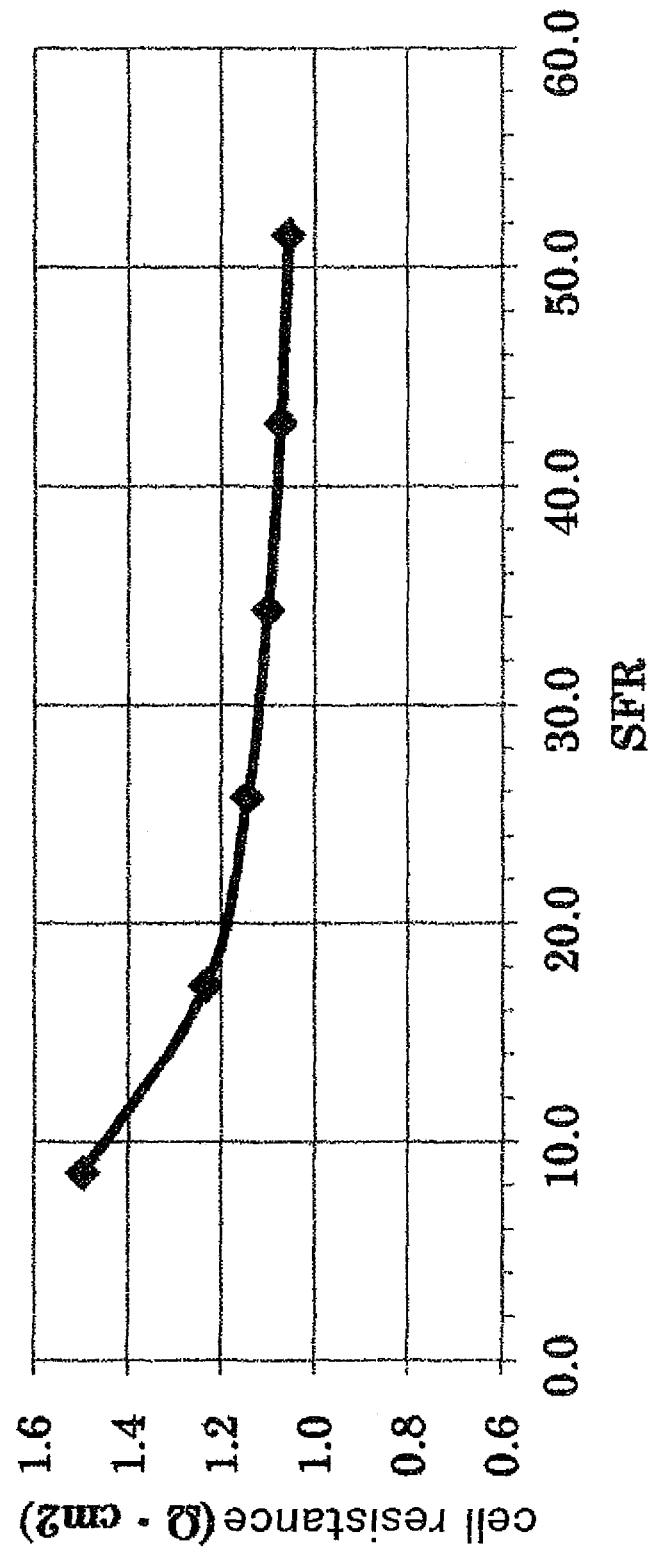
FIG. 14 is a graph depicting the relationship between an SFR (specific flow rate of electrolyte: the ratio of electrolyte necessary for the reaction to the flow rate of electrolyte to the cell during charging and discharging) and the cell resistance.
Figure 15:
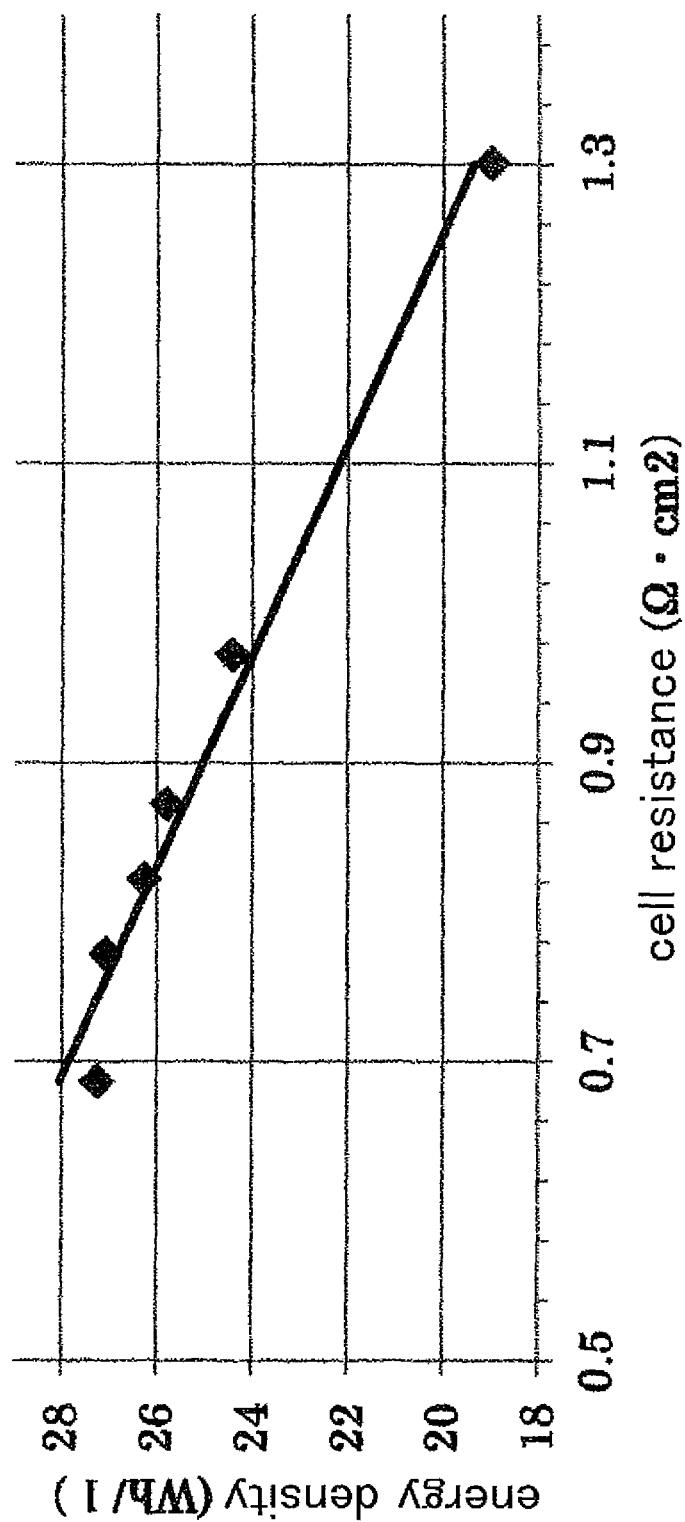
FIG. 15 is a graph depicting the relationship between the cell resistance and the energy density.

Control that uses the difference in voltage is control (electrolyte flow rate control) that increases the flow rate of the electrolyte if the value of the voltage difference is about to increase beyond a predetermined voltage difference upper limit set value U1 (for example, 100 mV). Once the flow rate of the electrolyte increases, an increase in the charging level of the electrolyte is suppressed, which stabilizes the voltage difference. By doing so, control that prevents the voltage difference from exceeding the upper limit set value U1 is realized, overcharging is prevented, and stabilized operation is realized. Although the cell resistance increases (see FIG. 15) when charging progresses, the charging level increases, and the energy density increases, when the flow rate of the electrolyte is increased, the cell resistance falls and the charging efficiency increases (see FIG. 14). By increasing the flow rate of electrolyte during discharging (i.e., during output), it is possible to suppress a drop in the open circuit voltage inside the cell stack 13 and to continue discharging with a high output for a long time. That is, by controlling the flow rate of the electrolyte (i.e., controlling the pumps) based on the change in the voltage difference, it is possible to increase the storage capacity of the redox flow battery 10 and to continue supplying power with a predetermined voltage for a longer time, which makes high-power charging and discharging possible. Note that if such control (electrolyte flow rate control) is carried out, it is possible to also carry out control that turns off the switch to stop the charging (or discharging) when the flow rate of electrolyte has increased and a predetermined upper limit flow rate set value U1 has been reached. When the flow rate of the electrolyte is increased, since the power consumption of the pumps increases and the charging cost increases, charging stops when the flow rate of electrolyte reaches a predetermined upper limit flow rate.

As one example, control that uses the voltage difference is control that turns the switch off and stops the charging (or discharging) when a state where the value of the voltage difference exceeds a predetermined voltage difference upper limit set value U1 has continued for a predetermined time. That is, control of a charging stopping operation (or a discharging stopping operation). When such control is carried out, overcharging (or over-discharging) of electrolyte is prevented.

As the voltage difference upper limit set value U1, it is possible to use a different value in accordance with the value of the entrance open circuit voltage used in the calculation of voltage difference. For example, during charging, a comparatively high value (for example, 150 mV) is set as the upper limit set value when the entrance open circuit voltage is a comparatively low value (for example, 1450 mV or below) and a comparatively low value (for example, 80 mV) is set as the upper limit set value when the entrance open circuit voltage is a comparatively high value (for example, 1450 mV or above). On the other hand, during discharging, a comparatively low value (for example, 80 mV) is set as the upper limit set value when the entrance open circuit voltage is a comparatively low value (for example, 1450 mV or below) and a comparatively high value (for example, 150 mV) is set as the upper limit set value when the entrance open circuit voltage is a comparatively high value (for example, 1450 mV or above). Note that the specific numeric values of the various set values described earlier are examples of the various set values. In reality, the set values are decided as appropriate for the conditions when designing a redox flow battery.

In this way, according to the battery 10 according to the first embodiment, it is possible to detect the entrance open circuit voltage (the open circuit voltage of the electrolyte immediately before flowing into the cells) and the exit open circuit voltage (the open circuit voltage of the electrolyte immediately after flowing out from the cells) during charging and discharging, which makes it possible to control the flow rate of electrolyte and carry out control that stops the charging and discharging using the detected open circuit voltages. In addition, it is possible to control the flow rate of electrolyte based on a voltage difference value and a power value that are detected in real time. By carrying out such control, it is possible to improve the usage efficiency of the battery. For example, power generated using natural energy such as wind power and sunlight varies constantly within a short period, with sudden changes also being common. In such cases, there is a limit on how stably a redox flow battery can be operated using only the entrance open circuit voltage. With the battery 10 according to the present embodiment, since the exit open circuit voltage and the voltage difference between the open circuit voltages are detected in real time as described earlier, it is possible to quickly and precisely grasp changes in such values and to flexibly respond to such variations. Accordingly, the battery is favorable as a rechargeable battery for power generated using natural energy. The batteries according to the second and third embodiments have the same configuration as the battery 10 according to the first embodiment in that it is possible to measure the upstream open circuit voltage using the entrance open circuit voltage measuring unit 80 and the downstream open circuit voltage using the exit open circuit voltage measuring unit 90. Accordingly, when the batteries according to both embodiments are used, it is possible to obtain the same effects as the effects obtained with the battery 10 according to the first embodiment described above.

Note that the redox flow battery, the cell stack, the liquid separation plates, and the method of operating a redox flow battery according to the present invention are not limited to the embodiments described above. Modifications that do not depart from the spirit of the present invention are also included in the range of the present invention.

For example, it is sufficient to provide the miniaturized cell (entrance open circuit voltage measuring portion) 81 of the entrance open circuit voltage measuring unit 80 and the miniaturized cell (exit open circuit voltage measuring portion) 91 of the exit open circuit voltage measuring unit 90 that are necessary to measure the entrance open circuit voltage and the exit open circuit voltage in the frame member 30 of one of the cells the constructs the cell stack 13. A configuration where both miniaturized cells 81 and 91 are installed in one of the pair of frame pieces 31 and 32 that construct one cell 20 and a configuration where one of the miniaturized cells is installed in each of the frame pieces that construct a pair of the frame pieces 31 and 32 can be given as example arrangements of the miniaturized cells 81 and 91. It is also sufficient to provide the inflow positive electrolyte flow splitting path 18a, the inflow negative electrolyte flow splitting path 18b, the outflow positive electrolyte flow splitting path 18c, and the outflow negative electrolyte flow splitting path 18d that are necessary to measure the entrance open circuit voltage and the exit open circuit voltage in the frame member 30 of one of the cells that constructs the cell stack 13. A configuration where both miniaturized cells 81 and 91 are installed in one of the pair of frame pieces 31 and 32 that construct one cell 20 and a configuration where one of the miniaturized cells 81 and 91 is installed in each of the frame pieces that construct a pair of the frame pieces 31 and 32 can be given as example arrangements of the flow paths.

Although the cell stack 13 of the battery 10 according to the first embodiment is configured with a plurality of cells 20 in a stack, it is also possible to use a cell stack 13 constructed of a plurality of sub-stacks. In such case, the respective sub-stacks are constructed by stacking a plurality of the cells 20. Also, although component elements (for example, through-holes) of the flow paths of electrolyte are formed in the separator membrane 21 of the cell 20 in the first embodiment, a configuration where flow paths are not formed in the separator membrane 21 is also possible. A configuration where flow paths are not formed in the separator membrane 21 by making the separator membrane 21 smaller or changing the form of the separator membrane 21 is also conceivable. Also, although the flow paths formed in the frame member 30 such as the liquid separation plates 50 and 70 of the cell stack 13 are paths formed inside members in the first embodiment, the present invention is not limited to such a configuration. As one example, it is possible to construct the flow paths by forming channels in the surfaces of members such as the liquid separation plates 50 and 70. Since the various members that construct the cell stack 13 are placed on top of one another in a stacked state, by forming channels in the surfaces of members, it is possible to have the flow paths constructed when the members are placed on top of one another. Also, although the controller of the battery 10 according to the first embodiment carries out control of the flow rate of electrolyte (the output of the pumps), switching-on control, and switching-off control based on the exit open circuit voltage and the voltage difference, it is possible to use a controller that is capable of carrying out other control based on the exit open circuit voltage and the voltage difference. For example, when there are large variations in the received power (input power supply) during charging or the supplied power (output power supply) during discharging, it would be conceivable to carry out control over the flow rate of electrolyte based on the power and voltage difference in real time. By carrying out such control, it is possible to improve the efficiency of the battery. In addition, as the method of operating a redox flow battery according to the present invention, it is not necessary to carry out all of the control described above. Control that includes at least one type of control is sufficient. When calculating the voltage difference by subtracting the input open circuit voltage from the exit open circuit voltage, as the exit open circuit voltage, it is possible to use an exit open circuit voltage that has been measured according to different conditions in accordance with the content of control or the like. More specifically, as examples, it is possible to use an exit open circuit voltage measured at the same time as the entrance open circuit voltage to be subtracted is measured, or an exit open circuit voltage measured when the electrolyte, which flowed into the positive electrode chamber and the negative electrode chamber when the entrance open circuit voltage to be subtracted was measured, has flowed out of the positive electrode chamber and the negative electrode chamber and flowed into the miniaturized cell 91 of the exit open circuit voltage measuring unit 90.

The invention claimed is:

1. A redox flow battery including: a positive electrolyte storage tank; a negative electrolyte storage tank; a cell stack; a positive electrolyte outward path that sends positive electrolyte, which has been sent out from the positive electrolyte storage tank, to positive electrode chambers of cells in the cell stack; a positive electrolyte return path that sends positive electrolyte, which has flowed out from the positive electrode chambers, to the positive electrolyte storage tank; a negative electrolyte outward path that sends negative electrolyte, which has been sent out from the negative electrolyte storage tank, to negative electrode chambers of the cells; and a negative electrolyte return path that sends negative electrolyte, which has flowed out from the negative electrode chambers, to the negative electrolyte storage tank, the redox flow battery comprising:

an upstream open circuit voltage measuring portion that measures an upstream open circuit voltage between the positive electrolyte inside the positive electrolyte outward path and the negative electrolyte inside the negative electrolyte outward path; and a downstream open circuit voltage measuring portion that measures a downstream open circuit voltage between the positive electrolyte inside the positive electrolyte return path and the negative electrolyte inside the negative electrolyte return path.

2. The redox flow battery according to claim 1, wherein the cell stack includes a plurality of sub-stack cells composed of a plurality of unit cells, each sub-stack cell includes a pair of liquid separation plates composed of a first liquid separation plate that is one liquid separation plate and in which a negative electrolyte inflow path, which is a downstream portion of the negative electrolyte outward path, is formed and a second liquid separation plate that is another liquid separation plate and in which a positive electrolyte inflow path, which is a downstream portion of the positive electrolyte outward path, is formed, out of a positive electrolyte outflow path, which is an upstream portion of the positive electrolyte return path, and a negative electrolyte outflow path, which is an upstream portion of the negative electrolyte return path, one outflow path is formed in the first liquid separation plate and another outflow path is formed in the second liquid separation plate, the first liquid separation plate of a first sub-stack cell, which is one out of the plurality of sub-stack cells, is disposed adjacent to the second liquid separation plate of a second sub-stack cell with is disposed next to the first sub-stack cell, the upstream open circuit voltage measuring portion measures the upstream open circuit voltage between the positive electrolyte inside the positive electrolyte outward path which is connected to the second liquid separation plate of the second sub-stack cell and the negative electrolyte inside the negative electrolyte outward path which is connected to the first liquid separation plate of the first sub-stack cell, and the downstream open circuit voltage measuring portion measures the downstream open circuit voltage between the positive electrolyte inside the positive electrolyte return path which is connected to one liquid separation plate out of the first liquid separation plate of the first sub-stack cell and the second liquid separation plate of the second sub-stack cell, and the negative electrolyte inside the negative electrolyte return path which is connected to the other liquid separation plate.

3. The redox flow battery according to claim 2, wherein an inlet of the positive electrolyte inflow path and an inlet of the negative electrolyte inflow path and an outlet of the positive electrolyte outflow path and an outlet of the negative electrolyte outflow path are disposed so that a straight line that joins the inlets and a straight line that joins the outlets do not intersect.

4. The redox flow battery according to claim 3, wherein the upstream open circuit voltage measuring portion and the downstream open circuit voltage measuring portion are disposed on electrolyte flow paths between the inlets or the outlets and the positive electrode chamber or the negative electrode chamber.

5. The redox flow battery according to claim 2, wherein the first liquid separation plate of the first sub-stack cell and the second liquid separation plate of the second sub-stack cell are disposed so that rear surfaces of the liquid separation plates contact one another, a first connecting hole that connects to the positive electrolyte inflow path is formed in the rear surface of the second liquid separation plate of the second sub-stack cell, and a third connecting hole that connects to the negative electrolyte inflow path is formed in the rear surface of the first liquid separation plate of the first sub-stack cell, a flow path that is one out of a second connecting hole that connects to the positive electrolyte outflow path, which is an upstream portion of the positive electrolyte return path, and a fourth connecting hole that connects to the negative electrolyte outflow path, which is an upstream portion of the negative electrolyte return path, is formed in the first liquid separation plate of the first sub-stack cell, and a connecting hole that connects to another flow path is formed in the second liquid separation plate of the second sub-stack cell, a first attachment member equipped with a first through-hole is attached to the first connecting hole, a second attachment member equipped with a second through-hole is attached to the second connecting hole, a third attachment member equipped with a third through-hole is attached to the third connecting hole, and a fourth attachment member equipped with a fourth through-hole is attached to the fourth connecting hole, the first connecting hole and the third connecting hole that are formed in different rear surfaces are disposed at positions so that the first connecting hole and the third connecting hole are opposite one another when the cell stack has been assembled, the second connecting hole and the fourth connecting hole that are formed in different rear surfaces are disposed at positions so that the second connecting hole and the fourth connecting hole are opposite one another when the cell stack has been assembled, each attachment member is equipped with a reaction electrode that is disposed inside a through-hole and an electrode that contacts the reaction electrode, at least one of the first attachment member and the third attachment member includes a separator membrane of the upstream open circuit voltage measuring portion that is sandwiched between the reaction electrode of the first attachment member and the reaction electrode of the third attachment member, at least one of the second attachment member and the fourth attachment member includes a separator membrane of the downstream open circuit voltage measuring portion that is sandwiched between the reaction electrode of the second attachment member and the reaction electrode of the fourth attachment member, and when the cell stack is assembled, the upstream open circuit voltage measuring portion is assembled by the first attachment member and the third attachment member and the downstream open circuit voltage measuring portion is assembled by the second attachment member and the fourth attachment member.

6. The redox flow battery according to claim 1, further comprising a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation.

7. The redox flow battery according to claim 6, wherein the controller controls the flow rate of electrolyte, the charging stopping operation, and the discharging stopping operation using the upstream open circuit voltage, the downstream open circuit voltage, and the voltage difference.

8. A method of operating a redox flow battery that sends positive electrolyte, which has been sent out from a positive electrolyte storage tank, via a positive electrolyte inflow path to positive electrode chambers of cells in a cell stack, sends positive electrolyte, which has flowed out from the positive electrode chambers, via a positive electrolyte outflow path to the positive electrolyte storage tank, sends negative electrolyte, which has been sent out from a negative electrolyte storage tank, via a negative electrolyte inflow path to negative electrode chambers of the cells, and sends negative electrolyte, which has flowed out from the negative electrode chambers, via a negative electrolyte outflow path to the negative electrolyte storage tank, the method comprising controlling at least one of a flow rate of electrolyte, a charging stopping operation, and a discharging stopping operation using at least one of a voltage difference between an upstream open circuit voltage, which is measured between the positive electrolyte inside the positive electrolyte inflow path and the negative electrolyte inside the negative electrolyte inflow path, and a downstream open circuit voltage, which is measured between the positive electrolyte inside the positive electrolyte outflow path and the negative electrolyte inside the negative electrolyte outflow path, and the downstream open circuit voltage.

9. The method of operating a redox flow battery according to claim 8, further comprising controlling the flow rate of electrolyte, the charging stopping operation, and the discharging stopping operation using the upstream open circuit voltage, the downstream open circuit voltage, and the voltage difference.

10. An open circuit voltage measuring unit for measuring an open circuit voltage of a redox battery, comprising:

an open circuit voltage measuring portion housed inside the unit;

a positive electrolyte circulation chamber;

a negative electrolyte circulation chamber;

a positive electrolyte inlet and a positive electrolyte outlet connected to the positive electrolyte circulation chamber;

a negative electrolyte inlet and a negative electrolyte outlet connected to the negative electrolyte circulation chamber; and a connecting hole that connects the circulation chambers, wherein the open circuit voltage measuring portion includes:

a separator membrane disposed at a position of the connecting hole;

a first reaction electrode disposed in contact with the separator membrane on a positive electrolyte circulation chamber side;

a second reaction electrode disposed in contact with the separator membrane on a negative electrolyte circulation chamber side;

an electrode in contact with one of the reaction electrodes; and an electrode in contact with another of the reaction electrodes.

11. The cell stack used in the redox flow battery according to claim 5.

12. A pair of liquid separation plates of a sub-stack cell used in the cell stack according to claim 2 wherein a third connecting hole that connects to the negative electrolyte inflow path is formed in a rear surface of the first liquid separation plate, a first connecting hole that connects to the positive electrolyte inflow path is formed in a rear surface of the second liquid separation plate, a flow path that is one out of a second connecting hole that connects to a positive electrolyte outflow path, which is an upstream portion of the positive electrolyte return path, and a fourth connecting hole that connects to a negative electrolyte outflow path, which is an upstream portion of the negative electrolyte return path, is formed in the first liquid separation plate, and a connecting hole that connects to another flow path is formed in the second liquid separation plate, a first attachment member equipped with a first through-hole is attached to the first connecting hole, a second attachment member equipped with a second through-hole is attached to the second connecting hole, a third attachment member equipped with a third through-hole is attached to the third connecting hole, and a fourth attachment member equipped with a fourth through-hole is attached to the fourth connecting hole, the first connecting hole and the third connecting hole that are disposed at positions so that the first connecting hole and the third connecting hole become opposite one another when the rear surfaces of the pair of liquid separation plates are placed in contact on top of one another, the second connecting hole and the fourth connecting hole are disposed at positions so that the second connecting hole and the fourth connecting hole become opposite one another when the rear surfaces of the pair of liquid separation plates are placed in contact on top of one another, each attachment member is equipped with a reaction electrode that is disposed inside a through-hole and an electrode that contacts the reaction electrode, at least one of the first attachment member and the third attachment member includes a separator membrane of the upstream open circuit voltage measuring portion that is sandwiched between the reaction electrode of the first attachment member and the reaction electrode of the third attachment member, and at least one of the second attachment member and the fourth attachment member includes a separator membrane of the downstream open circuit voltage measuring portion that is sandwiched between the reaction electrode of the second attachment member and the reaction electrode of the fourth attachment member.

13. The redox flow battery according to claim 2, further comprising a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation.

14. The redox flow battery according to claim 3, further comprising a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation.

15. The redox flow battery according to claim 4, further comprising a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation.

16. The redox flow battery according to claim 5, further comprising a controller that uses at least one value out of a voltage difference value between the upstream open circuit voltage and the downstream open circuit voltage and the downstream open circuit voltage value to control at least one of a flow rate of electrolyte, a charging stopping operation, and a discharging stopping operation.

* * * * *